(12) United States Patent
Lee et al.

(10) Patent No.: US 9,947,378 B2
(45) Date of Patent: Apr. 17, 2018

(54) SEMICONDUCTOR MEMORY DEVICE, A MEMORY MODULE INCLUDING THE SAME, AND A MEMORY SYSTEM INCLUDING THE SAME

(71) Applicant: SAMSUNG ELECTRONICS CO., LTD., Suwon-si, Gyeonggi-do (KR)

(72) Inventors: Ki Won Lee, Seoul (KR); Seung Jun Bae, Hwaseong-si (KR); Joon Young Park, Seoul (KR); Yong Cheol Bae, Yongin-si (KR)

(73) Assignee: SAMSUNG ELECTRONICS CO., LTD, Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/729,771

(22) Filed: Oct. 11, 2017

(65) Prior Publication Data

US 2018/0033470 A1 Feb. 1, 2018

Related U.S. Application Data

(63) Continuation of application No. 15/426,603, filed on Feb. 7, 2017, now Pat. No. 9,805,774, which is a continuation of application No. 14/723,614, filed on May 28, 2015, now Pat. No. 9,608,631.

(30) Foreign Application Priority Data

May 29, 2014 (KR) .......... 10-2014-0065149

(51) Int. Cl.
*G11C 7/00* (2006.01)
*G11C 7/12* (2006.01)
*H03K 19/00* (2006.01)

(52) U.S. Cl.
CPC .......... *G11C 7/12* (2013.01); *H03K 19/0005* (2013.01)

(58) Field of Classification Search
CPC ......... G11C 5/14; G11C 5/143; G11C 7/1078; G11C 7/1084
See application file for complete search history.

(56) References Cited

U.S. PATENT DOCUMENTS

| | | | |
|---|---|---|---|
| 5,144,585 A | 9/1992 | Min et al. | |
| 5,208,777 A | 5/1993 | Shibata | |
| 5,689,460 A | 11/1997 | Ooishi | |
| 5,850,363 A | 12/1998 | Jeon | |
| 5,910,924 A | 6/1999 | Tanaka et al. | |
| 6,052,325 A * | 4/2000 | Merritt | G11C 5/14 365/189.07 |
| 6,097,206 A | 8/2000 | Okajima et al. | |
| 6,643,173 B2 | 11/2003 | Takemura | |

(Continued)

FOREIGN PATENT DOCUMENTS

| KR | 1020100040423 | 4/2010 |
|---|---|---|
| KR | 1020110131366 | 12/2011 |
| KR | 1020130045144 | 5/2013 |

*Primary Examiner* — Tuan T Nguyen

(74) *Attorney, Agent, or Firm* — F. Chau & Associates, LLC

(57) ABSTRACT

A method of operating a memory controller includes: receiving a data signal from a memory device, wherein the data signal has an output high level voltage (VOH); determining a reference voltage according to the VOH; and comparing the data signal with the reference voltage to determine a received data value, wherein the VOH is proportional to a power supply voltage (VDDQ).

20 Claims, 24 Drawing Sheets

(56) References Cited

U.S. PATENT DOCUMENTS

| | | | |
|---|---|---|---|
| 6,958,947 B2 | 10/2005 | Park et al. | |
| 7,068,547 B2 | 6/2006 | Do | |
| 7,339,409 B2 | 3/2008 | Choi et al. | |
| 7,944,232 B2 | 5/2011 | Jang | |
| 8,008,944 B2 | 8/2011 | Dixit et al. | |
| 8,320,199 B2 | 11/2012 | Yoon | |
| 8,415,634 B2 | 4/2013 | Kim | |
| 8,441,283 B2 | 5/2013 | Kim | |
| 8,942,309 B1 * | 1/2015 | Ware | H04L 25/14 365/189.07 |
| 9,160,339 B2 | 10/2015 | Matano | |
| 9,401,721 B1 * | 7/2016 | Barakat | H04L 7/033 |
| 2012/0014156 A1 * | 1/2012 | Park | G11C 7/1078 365/51 |
| 2013/0182513 A1 | 7/2013 | Eom et al. | |
| 2015/0340069 A1 | 11/2015 | Arai et al. | |
| 2015/0348603 A1 | 12/2015 | Lee et al. | |
| 2017/0148496 A1 | 5/2017 | Lee et al. | |

\* cited by examiner

SEMICONDUCTOR MEMORY DEVICE, A MEMORY MODULE INCLUDING THE SAME, AND A MEMORY SYSTEM INCLUDING THE SAME

CROSS-REFERENCE TO RELATED PATENT APPLICATIONS

This application is continuation application of U.S. application Ser. No. 15/426,603 filed Feb. 7, 2017, which is a continuation application of U.S. application Ser. No. 14/723,614 filed on May 28, 2015, which claims priority under 35 U.S.C. § 119 to Korean Patent Application No. 10-2014-0065149, filed on May 29, 2014 in the Korean Intellectual Property Office, the disclosures of which are incorporated by reference herein in their entireties.

TECHNICAL FIELD

Exemplary embodiments of the inventive concept relate to a semiconductor memory device, a memory module including the same, and a memory system including the same, and more particularly, to a semiconductor memory device for reducing noise in a data signal thereof, a memory module including the same, and a memory system including the same.

DISCUSSION OF RELATED ART

A semiconductor memory device may exchange commands and data with an external system, e.g., a memory controller. When impedance of a bus line connecting the semiconductor memory device and the external system is different from that of a signal line directly connected with the bus line within the semiconductor memory device, signal reflection may occur. To prevent this, high-speed semiconductor memory devices may be provided with a device, e.g., an on-die termination (ODT) resistor, which matches impedance in transmission lines.

However, low power and high speed are typical requirements for semiconductor memory devices used in a mobile environment. Accordingly, techniques to secure signal integrity (SI) in data communication between a semiconductor memory device and an external system under the conditions of low power and high speed are being studied.

SUMMARY

According to an exemplary embodiment of the inventive concept, there is provided a method of operating a memory controller that includes: receiving a data signal from a memory device, wherein the data signal has an output high level voltage (VOH); determining a reference voltage according to the VOH; and comparing the data signal with the reference voltage to determine a received data value, wherein the VOH is proportional to a power supply voltage (VDDQ).

According to an exemplary embodiment of the inventive concept, there is provided a memory controller that includes: an on-die termination (ODT) resistor and a DQ pad, wherein the memory controller is configured to: receive, via the DQ pad, a data signal from a memory device, wherein the data signal has an output high level voltage (VOH); determine a reference voltage according to the VOH; and compare the data signal with the reference voltage to determine a received data value, wherein the VOH is proportional to a power supply voltage (VDDQ).

According to an exemplary embodiment of the inventive concept, there is provided a method of operating a memory controller, the method including: receiving a first data signal having a first output high level voltage (VOH), wherein the first VOH is proportional to a power supply voltage (VDDQ); outputting a command instructing a VOH of a second data signal to be changed; and receiving the second data signal, wherein the second data signal has the changed VOH, the changed VOH being proportional to VDDQ, wherein the first VOH and the changed VOH are different from each other.

According to an exemplary embodiment of the inventive concept, there is provided a memory system that includes: a memory controller; and a memory device, wherein the memory controller comprises: an on-die termination (ODT) resistor and a DQ pad, wherein the memory controller is configured to: receive, via the DQ pad, a data signal from the memory device, wherein the data signal has an output high level voltage (VOH); determine a reference voltage according to the VOH; and compare the data signal with the reference voltage to determine a received data value, wherein the VOH is proportional to a power supply voltage (VDDQ).

BRIEF DESCRIPTION OF THE DRAWINGS

The above and other features of the inventive concept will become more apparent by describing in detail exemplary embodiments thereof with reference to the attached drawings in which.

DETAILED DESCRIPTION OF THE EMBODIMENTS

Figure 1:
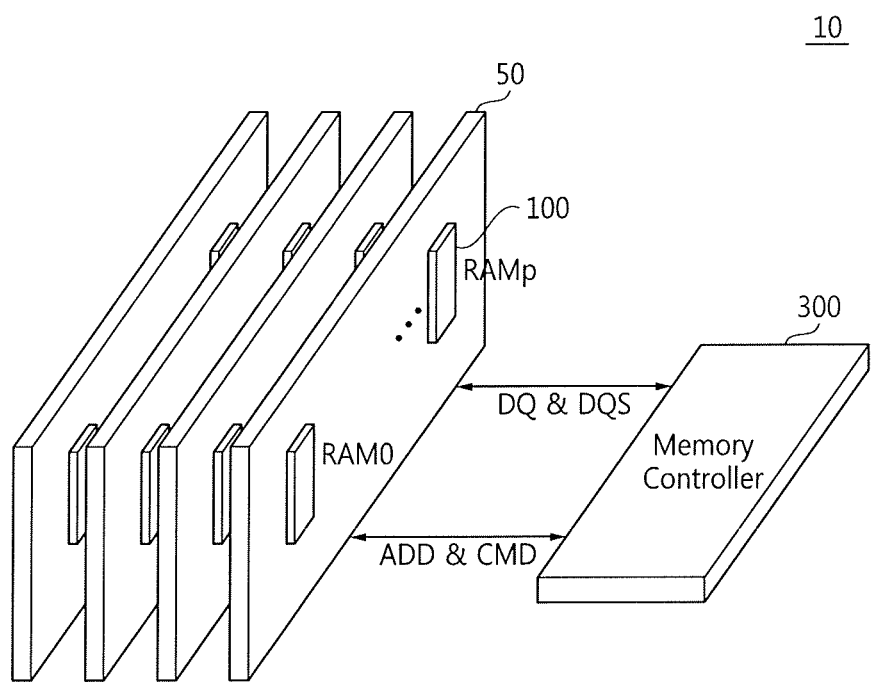
FIG. 1 is a schematic diagram of a memory system according to an exemplary embodiment of the inventive concept.

The inventive concept now will be described more fully hereinafter with reference to the accompanying drawings, in which exemplary embodiments are shown. This inventive concept may, however, be embodied in many different forms and should not be construed as limited to the embodiments set forth herein. In the drawings, the size and relative sizes of layers and regions may be exaggerated for clarity. Like numbers may refer to like elements throughout the application.

It will be understood that when an element is referred to as being "connected" or "coupled" to another element, it can be directly connected or coupled to the other element or intervening elements may be present.

As used herein, the singular forms "a", "an" and "the" are intended to include the plural forms as well, unless the context clearly indicates otherwise.

FIG. 1 is a schematic diagram of a memory system 10 according to an exemplary embodiment of the inventive concept. The memory system 10 may include a memory module 50 and a memory controller 300.

The memory module 50 may include a plurality of dies RAM0 through RAMp each of which corresponds to a semiconductor memory device. The memory module 50 may be implemented as a single in-line memory module (SIMM) or a dual in-line memory module (DIMM).

The dies RAM0 through RAMp may operate in response to address information ADD and a command signal CMD received from the memory controller 300 and may exchange a data signal DQ and a data strobe signal DQS with the memory controller 300. The memory controller 300 may control the overall operation, e.g., a read, write or refresh operation of the memory module 50 and may be implemented as a part of a system on chip (SoC).

Figure 2:
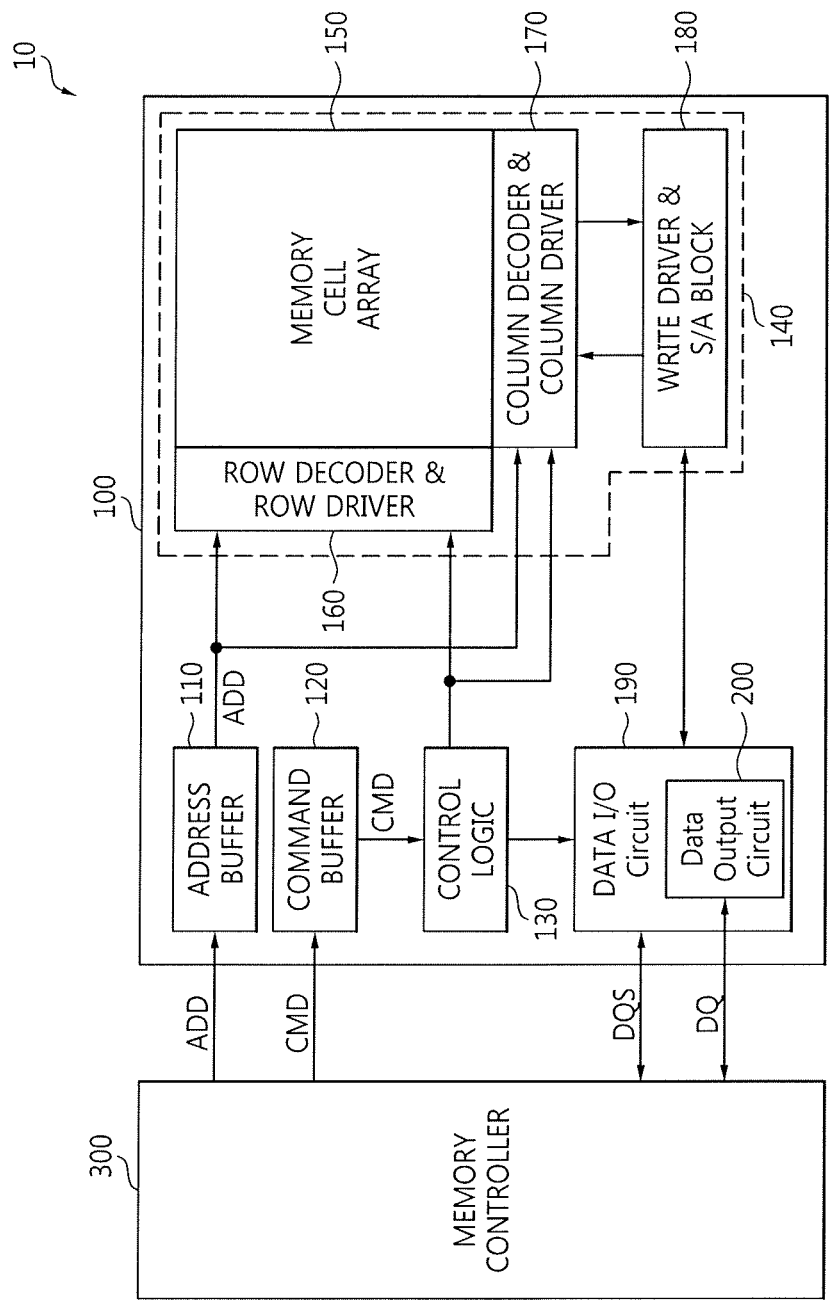
FIG. 2 is a detailed block diagram of the memory system illustrated in FIG. 1, according to an exemplary embodiment of the inventive concept.

FIG. 2 is a detailed block diagram of the memory system 10 illustrated in FIG. 1, according to an exemplary embodiment of the inventive concept. Referring to FIGS. 1 and 2, the memory system 10 may include a semiconductor memory device 100 and the memory controller 300. FIG. 2 shows one die (e.g., RAM0) included in the memory module 50 illustrated in FIG. 1 and the memory controller 300.

The semiconductor memory device 100 may include an address buffer 110, a command buffer 120, a control logic 130, a data storing unit 140, and a data input/output (I/O) circuit 190. The address buffer 110 may receive the address information ADD from the memory controller 300, may temporarily store the address information ADD, and may transmit the address information ADD to the data storing unit 140 according to the control of the control logic 130. The command buffer 120 may receive the command signal CMD from the memory controller 300, may temporarily store the command signal CMD, and may transmit the command signal CMD to the control logic 130 according to the control of the control logic 130.

The control logic 130 may control the overall operation of the semiconductor memory device 100. The control logic 130 may include a command decoder, a clock generator, and a mode register set (MRS) circuit.

The data storing unit 140 may include a memory cell array 150, a row decoder and row driver 160, a column decoder and column driver 170, and a write driver and sense amplifier (S/A) block 180.

The memory cell array 150 includes word lines, bit lines, and memory cells each of which is connected to one of the word lines and one of the bit lines. The memory cells may store data of at least one bit. The memory cells may be implemented as non-volatile memory cells that retain data even when power is cut off or volatile memory cells that retain data only while power is being supplied. Data may be stored in the memory cells using a fuse-cutting method using a physical laser or an electrical programming method. The memory cells may be dynamic random access memory (DRAM) cells, static RAM (SRAM) cells, synchronous DRAM (SDRAM) cells, electrically erasable programmable read-only memory (EEPROM) cells, flash memory cells, magnetic RAM (MRAM) cells, conductive bridging RAM (CBRAM) cells, ferroelectric RAM (FeRAM) cells, phase-change RAM (PRAM) cells, or resistive RAM (RRAM or ReRAM) cells.

The row decoder and row driver 160 may select one of the word lines based on the address information ADD output from the address buffer 110 and may drive the selected word line to a necessary operating voltage. The column decoder and column driver 170 may control the connection between each of the bit lines and the write driver and S/A block 180 based on the address information ADD output from the address buffer 110.

The write driver and S/A block 180 may receive write data from the data I/O circuit 190, generate a current signal corresponding to the write data and may apply the current signal to at least one bit line connected by the column decoder and column driver 170. The write driver and S/A block 180 may also sense and amplify a signal output from the at least one bit line connected by the column decoder and column driver 170, may generate read data corresponding to the sensed and amplified signal, and may transmit the read data to the data I/O circuit 190.

The data I/O circuit 190 may include a data input circuit and a data output circuit 200, which operate according to the control of the control logic 130 and which are connected to data I/O ports. The data output circuit 200 may transmit the data signal DQ to the memory controller 300. The structure and operations of the data output circuit 200 will be described in detail later.

The memory controller 300 may transmit various commands CMD and the address information ADD to the semiconductor memory device 100. The commands CMD may be used for controlling the operation of the semiconductor memory device 100 and the address information ADD may identify locations of the memory cell array 150, which will perform a read, write or test operation. The memory controller 300 may transmit write data to be written to the memory cell array 150 to the semiconductor memory device 100 and may receive read data from the semiconductor memory device 100.

Figure 3:
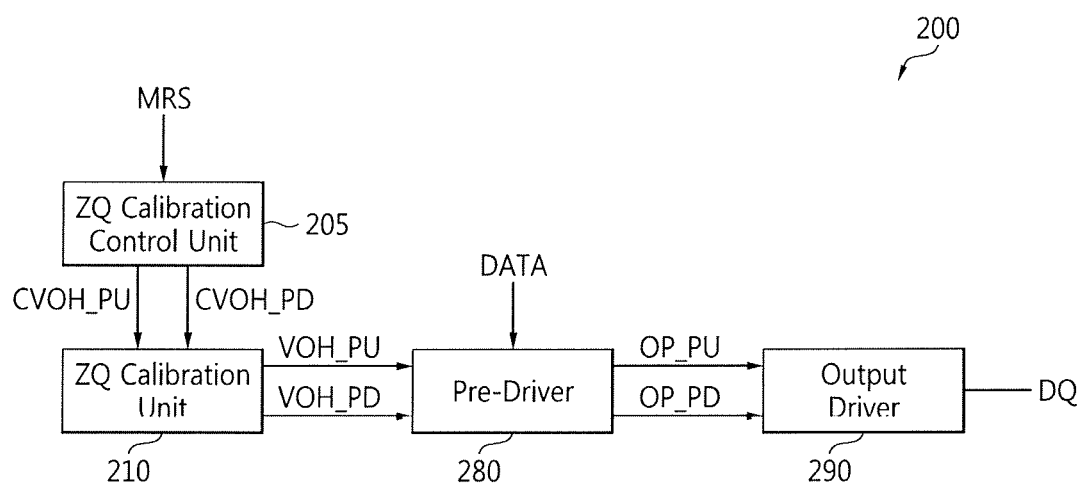
FIG. 3 is a detailed block diagram of a data output circuit illustrated in FIG. 2, according to an exemplary embodiment of the inventive concept.
Figure 4:
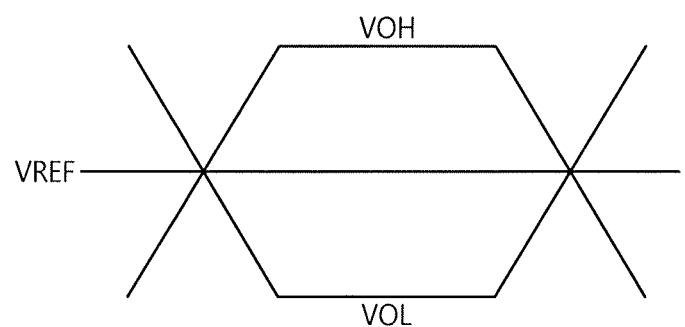
FIG. 4 is a diagram for explaining the operation of the data output circuit illustrated in FIG. 3, according to an exemplary embodiment of the inventive concept.

FIG. 3 is a detailed block diagram of the data output circuit 200 illustrated in FIG. 2, according to an exemplary embodiment of the inventive concept. FIG. 4 is a diagram for explaining the operation of the data output circuit 200 illustrated in FIG. 3, according to an exemplary embodiment of the inventive concept.

Referring to FIGS. 2 through 4, the data output circuit 200 may receive internal data DATA, e.g., read data, and may output the data signal DQ according to the control of the control logic 130. The data signal DQ may have a high level or a low level according to the internal data DATA. The data signal DQ is an alternative current (AC) signal that swings between an output high-level voltage (hereinafter, referred to as "VOH") and an output low-level voltage (hereinafter, referred to as "VOL"), as shown in FIG. 4.

The memory controller 300 may receive the data signal DQ from each of the dies RAM0 through RAMp, may determine the VOH and VOL, and may determine a reference voltage VREF from the VOH and VOL. The memory controller 300 may compare the data signal DQ with the reference voltage VREF and may determine a received data value (e.g., 0 or 1). Accordingly, by setting the VOH to determine the reference voltage VREF, data reliability can be increased.

Various process-voltage-temperature (PVT) conditions may be applied to the dies RAM0 through RAMp. The PVT conditions may include nonuniform doping in a wafer process, a voltage drop as current passes through different elements when power is supplied, and a temperature along a path through which a signal passes. AC on-resistance (hereinafter, referred to as "Ron AC") at the output side of the semiconductor memory device 100 may vary with the PVT conditions, and the VOH of the data signal DQ may vary with the Ron AC. The Ron AC will be described in detail with reference to FIG. 9 later.

A PVT condition under which the Ron AC is minimized is referred to as a slow corner SS and a PVT condition under which the Ron AC is maximized is referred to as a fast corner FF. The slow corner SS and the fast corner FF are each a PVT corner.

When a difference in the Ron AC between the slow corner SS and the fast corner FF is large, this large difference leads a large difference in the VOH of the data signal DQ. As a result, the signal integrity (SI) of the semiconductor memory device 100 is decreased. In particular, when the data output circuit 200 is implemented as a low voltage swing terminated logic (LVSTL), noise more sensitive to the Ron AC difference may be included in the data signal DQ. Therefore, the Ron AC difference at both the slow corner SS and the fast corner FF is minimized.

The memory controller 300 may instruct the semiconductor memory device 100 to change (1) the VOH of the data signal DQ or (2) an impedance of an on-die termination (ODT) resistor ($R_{SOC\_ODT}$ in FIG. 7) of the memory controller 300, in the form of a command CMD. The MRS circuit of the control logic 130 may generate a predetermined MRS signal according to the instruction to change the VOH of the data signal DQ or the impedance of the ODT resistor $R_{SOC\_ODT}$ of the memory controller 300.

The data output circuit 200 may perform ZQ calibration according to the MRS signal to output the data signal DQ with a changed VOH. The MRS signal may vary with the impedance of the ODT resistor $R_{SOC\_ODT}$ of the memory controller 300. The impedance is identified by the control logic 130.

The ZQ calibration is an operation of matching the impedance of the data output circuit 200 with the impedance of the ODT resistor $R_{SOC\_ODT}$ of the memory controller 300 to prevent signal reflection due to impedance mismatching. The ZQ calibration in the data output circuit 200 according to an exemplary embodiment of the inventive concept may also include a VOH control operation for reducing the Ron AC difference in addition to the impedance matching.

The data output circuit 200 may include a ZQ calibration control unit 205, a ZQ calibration unit 210, a pre-driver 280, and an output driver 290.

The ZQ calibration control unit 205 may generate a VOH control code according to the MRS signal. The MRS signal may include information about the impedance of the ODT resistor $R_{SOC\_ODT}$ of the memory controller 300 illustrated in FIG. 7. The MRS signal may include information indicating whether to increase or decrease the VOH of the data signal DQ.

The ZQ calibration control unit 205 may generate the VOH control code corresponding to the information about the impedance of the ODT resistor $R_{SOC\_ODT}$ of the memory controller 300. The ZQ calibration control unit 205 may also generate the VOH control code corresponding to the information indicating whether to increase or decrease the VOH. The VOH control code may include a pull-up VOH control code CVOH_PU and a pull-down VOH control code CVOH_PD.

The pull-up VOH control code CVOH_PU may be a code for changing a current generated by a pull-up driver (292 in FIG. 7) of the output driver 290 and the pull-down VOH control code CVOH_PD may be a code for changing the current generated by the pull-up driver 292 of the output driver 290 and a resistance of a pull-down driver (294 in FIG. 7) of the output driver 290. Accordingly, to change only the current generated by the pull-up driver 292, the ZQ calibration control unit 205 may change the pull-up VOH control code CVOH_PU. To change both the current generated by the pull-up driver 292 and the resistance of the pull-down driver 294, the ZQ calibration control unit 205 may change the pull-down VOH control code CVOH_PD. In an exemplary embodiment of the inventive concept, the functions of the ZQ calibration control unit 205 may be performed by the control logic 130.

The ZQ calibration unit 210 may generate a VOH code according to the pull-up VOH control code CVOH_PU and the pull-down VOH control code CVOH_PD. The VOH code may include a pull-up VOH code VOH_PU and a pull-down VOH code VOH_PD. The pull-up VOH code VOH_PU may be a code for determining the current generated by the pull-up driver 292 and the pull-down VOH code VOH_PD may be a code for determining the current generated by the pull-up driver 292 and the resistance of the pull-down driver 294. The structure and the operations of the ZQ calibration unit 210 will be described in detail with reference to FIGS. 5 through 7 later.

The pre-driver 280 may generate a pull-up operating signal OP_PU and a pull-down operating signal OP_PD based on the internal data DATA and the VOH code, e.g., the pull-up VOH code VOH_PU and the pull-down VOH code VOH_PD. For instance, when the internal data DATA is at a high level, the pre-driver 280 may buffer the pull-up VOH code VOH_PU and generate (1) the pull-up operating signal OP_PU to be the same as the pull-up VOH code VOH_PU and (2) the pull-down operating signal OP_PD for turning off all transistors included in the pull-down driver 294. When the internal data DATA is at a low level, the pre-driver 280 may buffer the pull-down VOH code VOH_PD and generate (1) the pull-down operating signal OP_PD to be the same as the pull-down VOH code VOH_PD and (2) the pull-up operating signal OP_PU for turning off all transistors included in the pull-up driver 292.

In other words, the pre-driver 280 may determine the current generated by the pull-up driver 292 and the resistance of the pull-down driver 294 at the time when the output driver 290 outputs the data signal DQ.

The output driver 290 may include the pull-up driver 292 that generates the current determined by the pull-up operating signal OP_PU and the pull-down driver 294 that has the resistance determined by the pull-down operating signal OP_PD. The structure and operations of the output driver 290 will be described in detail with reference to FIG. 7 later.

Figure 5:
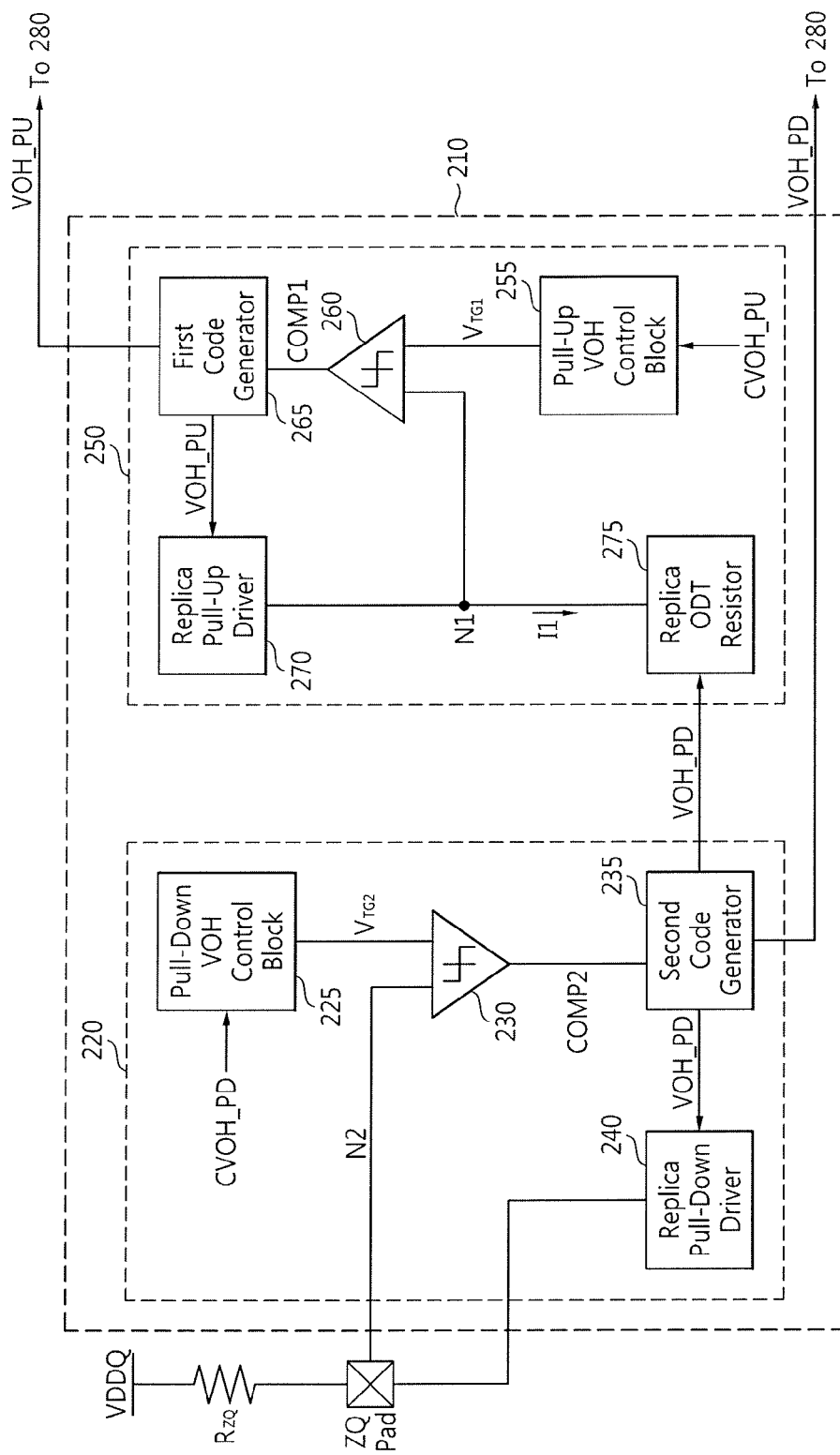
FIG. 5 is a detailed block diagram of a ZQ calibration unit illustrated in FIG. 3, according to an exemplary embodiment of the inventive concept.

FIG. 5 is a detailed block diagram of the ZQ calibration unit 210 illustrated in FIG. 3, according to an exemplary embodiment of the inventive concept. Referring to FIGS. 2 through 5, the ZQ calibration unit 210 may include a first ZQ calibration unit 250 and a second ZQ calibration unit 220.

The first ZQ calibration unit 250 may generate the pull-up VOH code VOH_PU, which determines the current generated by the pull-up driver 292 of the output driver 290, based on a first target VOH $V_{TG1}$ determined by the pull-up VOH control code CVOH_PU. The first ZQ calibration unit 250 may include a pull-up VOH control block 255, a first comparator 260, a first code generator 265, a replica pull-up driver 270, and a replica ODT resistor 275.

The pull-up VOH control block 255 may generate the first target VOH $V_{TG1}$ according to the pull-up VOH control code CVOH_PU. The structure and the operations of the pull-up VOH control block 255 will be described in detail with reference to FIG. 6 later.

The first comparator 260 may generate and output a first comparison result COMP1 by comparing the first target VOH $V_{TG1}$ with a voltage of a first node N1. The first code generator 265 may generate the pull-up VOH code VOH_PU based on the first comparison result COMP1 and may transmit the pull-up VOH code VOH_PU to the pre-driver 280 and the replica pull-up driver 270.

The replica pull-up driver 270 may generate a first current I1 flowing across the first node N1 according to the pull-up VOH code VOH_PU. The replica pull-up driver 270 may have the same structure as the pull-up driver 292 illustrated in FIG. 7. In other words, a sixth node N6 and a DQ pad of the pull-up driver 292 in FIG. 7 may correspond to the first node N1 of the replica pull-up driver 270 in FIG. 5. The replica pull-up driver 270 may be connected to the replica ODT resistor 275 via the first node N1. The first current I1 may determine the voltage of the first node N1 together with a resistance of the replica ODT resistor 275.

The replica ODT resistor 275 may determine the voltage of the first node N1 based on the first current I1. The replica ODT resistor 275 may be implemented as a resistor having the same impedance as the ODT resistor $R_{SOC.ODT}$ illustrated in FIG. 7. The resistance of the replica ODT resistor 275 may be determined by the pull-down VOH code VOH_PD generated by a second code generator 235.

Assuming that the pull-up VOH control block 255 receives the pull-up VOH control code CVOH_PU corresponding to a particular VOH, the operations of the first ZQ calibration unit 250 will be described below. It is also assumed that the particular VOH (e.g., VDDQ/2.5) is higher than a current VOH (e.g., VDDQ/3).

The pull-up VOH control block 255 generates the first target VOH $V_{TG1}$ corresponding to the pull-up VOH control code CVOH_PU corresponding to the particular VOH (e.g., VDDQ/2.5). Since the voltage of the first node N1 is the same as the current VOH, the first comparator 260 may generate the first comparison result COMP1 corresponding to the determination that the voltage of the first node N1 is lower than the first target VOH $V_{TG1}$.

The first code generator 265 may generate the pull-up VOH code VOH_PU for increasing the first current I1 of the replica pull-up driver 270 based on the first comparison result COMP1. For instance, it is assumed that like the pull-up driver 292 illustrated in FIG. 7, the replica pull-up driver 270 includes "n" pull-up transistors NU0 through NUn and the size, e.g., the channel width/channel length of the pull-up transistors NU0 through NUn increases sequentially from the 0th pull-up transistor NU0 toward the n-th pull-up transistor NUn. In this case, when bits (e.g., VOH_PU0 through VOH_PUn respectively corresponding to OP_PU0 through OP_PUn) of the pull-up VOH code VOH_PU, which are respectively input to the pull-up transistors NU0 through NUn, are "0001 0000", the first code generator 265 may generate the pull-up VOH code VOH_PU having bits "1001 0000" to increase the first current I1.

As the first current I1 increases, the voltage of the first node N1 can be increased in relation with the replica ODT resistor 275 according to Ohm's law. Thereafter, the generation of the new pull-up VOH code VOH_PU may be repeated until the voltage of the first node N1 becomes the same as (or pretty close to) the first target VOH $V_{TG1}$.

Figure 7:
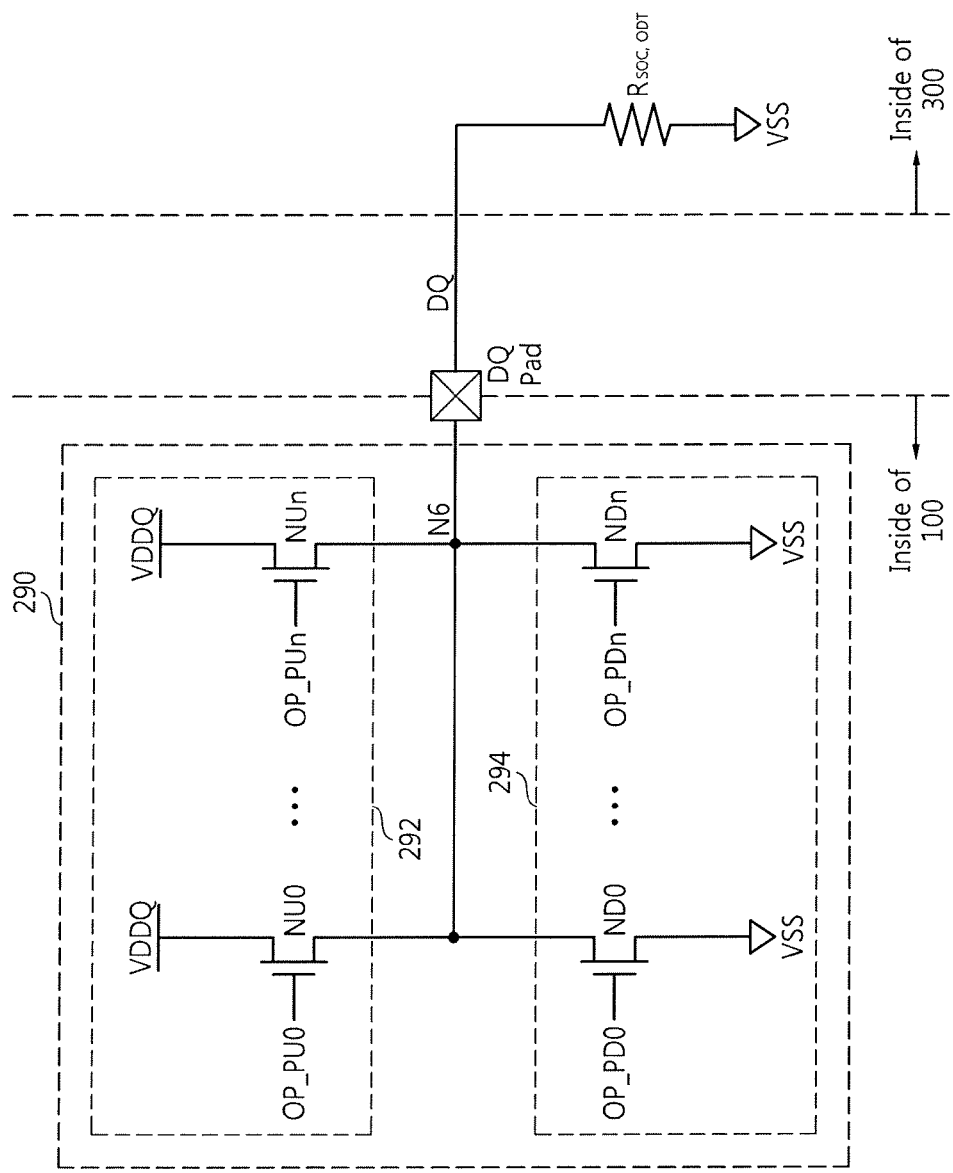
FIG. 7 is a detailed circuit diagram of an output driver illustrated in FIG. 3, according to an exemplary embodiment of the inventive concept.

Since the replica pull-up driver 270 and the replica ODT resistor 275 respectively correspond to the pull-up driver 292 and the ODT resistor $R_{SOC.ODT}$, the first node N1 in FIG. 5 corresponds to the DQ pad in FIG. 7. Accordingly, the VOH of the data signal DQ is calibrated to the particular VOH (e.g., VDDQ/2.5) by the operation of the first ZQ calibration unit 250.

The second ZQ calibration unit 220 may generate the pull-down VOH code VOH_PD, which determines the resistance of the pull-down driver 294 of the output driver 290, based on a second target VOH $V_{TG2}$ determined by the pull-down VOH control code CVOH_PD. The second ZQ calibration unit 220 may include a pull-down VOH control block 225, a second comparator 230, the second code generator 235, and a replica pull-down driver 240.

The pull-down VOH control block 225 may generate the second target VOH $V_{TG2}$ according to the pull-down VOH control code CVOH_PD. The structure and the operations of the pull-down VOH control block 225 will be described in detail with reference to FIG. 6 later.

The second comparator 230 may generate and output a second comparison result COMP2 by comparing the second target VOH $V_{TG2}$ with a voltage of a second node N2, e.g., a voltage of a ZQ pad. The second code generator 235 may generate the pull-down VOH code VOH_PD based on the second comparison result COMP2 and transmit the pull-down VOH code VOH_PD to the pre-driver 280, the replica pull-down driver 240, and the replica ODT resistor 275.

The replica pull-down driver 240 may have a resistance varying with the pull-down VOH code VOH_PD and may determine the voltage of the second node N2. The replica pull-down driver 240 may have the same structure as the pull-down driver 294 illustrated in FIG. 7. In other words, the sixth node N6 of the pull-down driver 294 in FIG. 7 may correspond to the second node N2 of the replica pull-down driver 240 in FIG. 5. The replica pull-down driver 240 may be connected to a ZQ resistor $R_{ZQ}$ via the ZQ pad. The resistance of the replica pull-down driver 240 may determine the voltage of the second node N2 because it is used to divide a power supply voltage VDDQ together with the ZQ resistor $R_{ZQ}$.

The ZQ resistor $R_{ZQ}$ may be provided outside the semiconductor memory device 100, e.g., in an area except for the dies RAM0 through RAMp in the memory module 50, for ZQ calibration. The ZQ resistor $R_{ZQ}$ may have a resistance of 240Ω, but the inventive concept is not restricted to this example.

Assuming that the pull-down VOH control block 225 receives the pull-down VOH control code CVOH_PD for increasing the VOH and decreasing the resistance of the replica pull-down driver 240 and the replica ODT resistor 275, the operations of the second ZQ calibration unit 220 will be described below.

The pull-down VOH control block 225 generates the second target VOH $V_{TG2}$ corresponding to the pull-down VOH control code CVOH_PD for increasing the current VOH (e.g., VDDQ/3). The second target VOH $V_{TG2}$ may be lower than the current VOH. When the voltage of the second node N2 is the same as the current VOH, the second comparator 230 may generate the second comparison result COMP2 corresponding to the determination that the voltage of the second node N2 is higher than the second target VOH $V_{TG2}$.

The second code generator 235 may generate the pull-down VOH code VOH_PD for decreasing the resistance of the replica pull-down driver 240 based on the second comparison result COMP2. For instance, it is assumed that like the pull-down driver 294 illustrated in FIG. 7, the replica pull-down driver 240 includes "n" pull-down transistors ND0 through NDn and the size, e.g., the channel width/channel length of the pull-down transistors ND0 through NDn increases sequentially from the 0-th pull-down transistor ND0 toward the n-th pull-down transistor NDn. In this case, when bits (e.g., VOH_PD0 through VOH_PDn respectively corresponding to OP_PD0 through OP_PDn) of the pull-down VOH code VOH_PD, which are respectively input to the pull-down transistors ND0 through NDn, are "0001 0000", the second code generator 235 may generate the pull-down VOH code VOH_PD having bits "1001 0000" to decrease the resistance of the replica pull-down driver 240. As a result, the voltage of the second node N2 is decreased.

The generation of the new pull-down VOH code VOH_PD may be repeated until the voltage of the second node N2 becomes the same as (or pretty close to) the second target VOH $V_{TG2}$.

When the pull-down VOH code VOH_PD for decreasing the resistance of the replica pull-down driver 240 is generated, the resistance of the replica ODT resistor 275, which is determined by the pull-down VOH code VOH_PD, is also decreased. Accordingly, the voltage of the first node N1 is decreased and, when the first target VOH $V_{TG1}$ is the same as the current VOH (e.g., VDDQ/3), the first comparator 260 may generate the first comparison result COMP1 corresponding to the determination that the voltage of the first node N1 is lower than the first target VOH $V_{TG1}$.

The first code generator 265 may generate the pull-up VOH code VOH_PU enabling the replica pull-up driver 270 to increase the first current I1 based on the first comparison result COMP1. As the first current I1 increases, the voltage of the first node N1 can be increased in relation with the replica ODT resistor 275 according to Ohm's law. Thereafter, the generation of the new pull-up VOH code VOH_PU may be repeated until the voltage of the first node N1 becomes the same as (or pretty close to) the first target VOH $V_{TG1}$.

Since the replica pull-up driver 270 and the replica ODT resistor 275 in FIG. 5 respectively correspond to the pull-up driver 292 and the ODT resistor $R_{SOC.ODT}$ in FIG. 7, the first node N1 in FIG. 5 corresponds to the DQ pad in FIG. 7. Accordingly, the VOH of the data signal DQ is increased and the resistance of the pull-down driver 294 and the ODT resistor $R_{SOC.ODT}$ is adjusted by the operation of the second ZQ calibration unit 220. Hereinafter, it is assumed that the resistance of the replica ODT resistor 275 has become the same as the impedance of the ODT resistor $R_{SOC.ODT}$ of the memory controller 300 by the operation of the second ZQ calibration unit 220.

Figure 6:
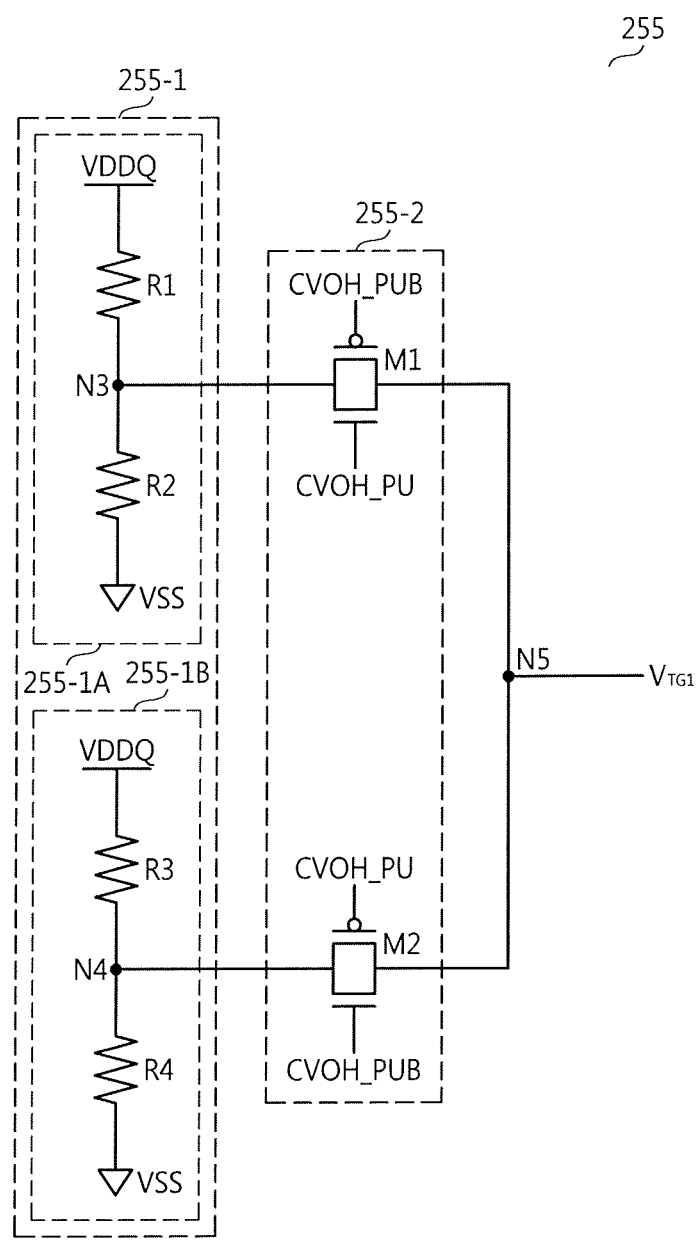
FIG. 6 is a diagram of a pull-up output high-level voltage VOH control block illustrated in FIG. 5, according to an exemplary embodiment of the inventive concept, wherein VOH means "output high-level voltage;"

FIG. 6 is a diagram of the pull-up VOH control block 255 illustrated in FIG. 5, according to an exemplary embodiment of the inventive concept. Referring to FIGS. 5 and 6, the pull-up VOH control block 255 may include a plurality of voltage dividers 255-1 and a selection circuit 255-2.

The voltage dividers 255-1 may include a first voltage divider 255-1A and a second voltage divider 255-1B, which respectively generate divided power supply voltages (e.g., a voltage at a node N3 and a voltage at a node N4) as a result of dividing the power supply voltage VDDQ. Although the voltage dividers 255-1 include two voltage dividers 255-1A and 255-1B in the embodiment illustrated in FIG. 6, the inventive concept is not restricted to this embodiment. For instance, the voltage dividers 255-1 may include three or more voltage dividers.

The first voltage divider 255-1A may include a first resistor R1 and a second resistor R2 connected in series between the power supply voltage VDDQ and a ground voltage VSS. The second voltage divider 255-1B may include a third resistor R3 and a fourth resistor R4 connected in series between the power supply voltage VDDQ and the ground voltage VSS. The power supply voltage VDDQ may be in a range of 1.0V to 1.2 V and the ground voltage VSS may be 0 V. Hereinafter, it is assumed that the ground voltage VSS is 0 V.

The first voltage divider 255-1A may generate the divided power supply voltage (e.g., the voltage at the node N3) corresponding to a result of multiplying the power supply voltage VDDQ by a voltage division ratio of the first and second resistors R1 and R2, e.g., R2/(R1+R2). The second voltage divider 255-1B may generate the divided power supply voltage (e.g., the voltage at the node N4) corresponding to a result of multiplying the power supply voltage VDDQ by a voltage division ratio of the third and fourth resistors R3 and R4, e.g., R4/(R3+R4). For instance, when R1=2R, R2=R, R3=3R, and R4=R (where R is a positive number), the voltage at the node N3 is VDDQ/3 and the voltage at the node N4 is VDDQ/2.5.

The selection circuit 255-2 may select one of a plurality of divided power supply voltages (e.g., the voltage at the node N3 and the voltage at the node N4) as the first target VOH $V_{TG1}$ according to the pull-up VOH control code CVOH_PU generated by the MRS signal. The selection circuit 255-2 may include a first switch M1 and a second switch M2. Each of the switches M1 and M2 may have a transmission gate structure in which an N-channel metal-oxide semiconductor (NMOS) transistor and a P-channel MOS (PMOS) transistor are connected in parallel. The first switch M1 may receive the pull-up VOH control code CVOH_PU and the second switch M2 may receive an inverted pull-up VOH control code CVOH_PUB.

For instance, it is assumed that the pull-up VOH control code CVOH_PU includes one bit. When the pull-up VOH control code CVOH_PU is at a high level, the first switch M1 may connect the third node N3 and a fifth node N5 to select the voltage at the third node N3 as the first target VOH $V_{TG1}$. When the pull-up VOH control code CVOH_PU is at a low level, the second switch M2 may connect the fourth node N4 and the fifth node N5 to select the voltage at the fourth node N4 as the first target VOH $V_{TG1}$.

For instance, when the ODT resistor $R_{SOC\_ODT}$ of the memory controller 300 has a resistance of 60Ω, the pull-up VOH control code CVOH_PU may be at the high level and VDDQ/3 may be selected as the first target VOH $V_{TG1}$. When the ODT resistor $R_{SOC\_ODT}$ of the memory controller 300 has a resistance of 120Ω, the pull-up VOH control code CVOH_PU may be at the low level and VDDQ/2.5 may be selected as the first target VOH $V_{TG1}$. In other words, the first target VOH $V_{TG1}$ is determined depending on the resistance of the ODT resistor $R_{SOC\_ODT}$ of the memory controller 300. Therefore, the VOH to which the current VOH of the data signal DQ will be calibrated is determined.

For instance, when the ODT resistor $R_{SOC\_ODT}$ of the memory controller 300 has a resistance of 34, 40, or 60Ω, VDDQ/3 may be selected as the first target VOH $V_{TG1}$. When the ODT resistor $R_{SOC\_ODT}$ of the memory controller 300 has a resistance of 80, 120, or 240Ω, VDDQ/2.5 may be selected as the first target VOH $V_{TG1}$. Alternatively, when the ODT resistor $R_{SOC\_ODT}$ of the memory controller 300 has a resistance of 34, 40, 60, 80, 120, or 240Ω, VDDQ/3.5, VDDQ/3.25, VDDQ/3, VDDQ/2.75, VDDQ/2.5, or VDDQ/2.25 may be respectively selected as the first target VOH $V_{TG1}$.

Since the voltage dividers 255-1 include only two voltage dividers 255-1A and 255-1B in the embodiment illustrated in FIG. 6, the description was made on the premise that the pull-up VOH control code CVOH_PU is 1-bit code. However, the inventive concept is not restricted thereto. For example, when the voltage dividers 255-1 include three or more voltage dividers, the pull-up VOH control code CVOH_PU may have two or more bits.

In other words, the pull-up VOH control block 255 may select as the first target VOH $V_{TG1}$ one of divided power supply voltages (e.g., the voltage at the node N3 and the voltage at the node N4) obtained by dividing the power supply voltage VDDQ at a predetermined ratio according to the pull-up VOH control code CVOH_PU generated by the MRS signal. Consequently, the VOH of the data signal DQ may be calibrated to the first target VOH $V_{TG1}$ by the operation of the first calibration unit 250.

FIG. 7 is a detailed circuit diagram of the output driver 290 illustrated in FIG. 3, according to an exemplary embodiment of the inventive concept. Referring to FIGS. 3, 5, and 7, the output driver 290 may include the pull-up driver 292 and the pull-down driver 294.

The pull-up driver 292 may include the 0th through n-th pull-up transistors NU0 through NUn connected between the power supply voltage VDDQ and the sixth node N6. Each of the 0th through n-th pull-up transistors NU0 through NUn may be implemented as an NMOS transistor.

The pull-down driver 294 may include the 0th through n-th pull-down transistors ND0 through NDn connected between the ground voltage VSS and the sixth node N6. Each of the 0th through n-th pull-down transistors ND0 through NDn may be implemented as an NMOS transistor.

When the internal data DATA is at the high level, the pull-up driver 292 may receive the pull-up operating signal OP_PU corresponding to the pull-up VOH code VOH_PU from the pre-driver 280 and may generate the current determined by the pull-up VOH code VOH_PU. The transistors ND0 through NDn included in the pull-down driver 294 may all be turned off according to the pull-down operating signal OP_PD for turning off the transistors ND0 through NDn.

At this time, the current generated by the pull-up driver 292 may be transmitted to the ODT resistor $R_{SOC\_ODT}$ in the memory controller 300 via the DQ pad. The data signal DQ that the memory controller 300 receives is determined by the current generated by the pull-up driver 292 and the ODT resistor $R_{SOC\_ODT}$ and it has the VOH that has been calibrated according to the pull-up VOH code VOH_PU generated by the ZQ calibration unit 210.

When the internal data DATA is at the low level, the pull-up driver 292 may receive the pull-up operating signal OP_PU for turning off all the transistors NU0 through NUn from the pre-driver 280, and thus, the transistors NU0 through NUn included in the pull-up driver 292 may all be turned off according to the pull-up operating signal OP_PU. The pull-down driver 294 may receive the pull-down operating signal OP_PD corresponding to the pull-down VOH code VOH_PD and may have the resistance determined by the pull-down VOH code VOH_PD. At this time, no current is generated by the pull-up driver 292, and therefore, the data signal DQ that the ODT resistor $R_{SOC\_ODT}$ receives has the VOL the same as the ground voltage VSS.

According to an exemplary embodiment of the inventive concept, the total resistance, e.g., termination resistance (RTT) of the pull-up driver 292 or the pull-down driver 294 may be changed in response to a particular pull-up or pull-down operating signal OP_PU or OP_PD. In this case, single loading or double loading can be implemented by changing the number of DIMMs (e.g., the memory modules 50 in FIG. 1) inserted into a memory slot and an RTT appropriate to conditions can be selected. For instance, the RTT may be changed from $R_{ZQ}/1$ to $R_{ZQ}/2$ and $R_{ZQ}/4$ (where $R_{ZQ}$=240Ω) according to an MRS setting.

Figure 8:
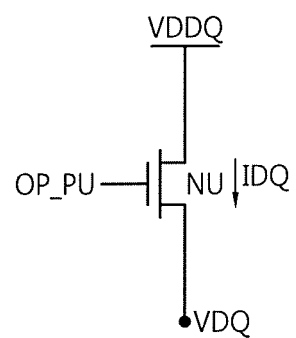
FIG. 8 is a diagram of an equivalent transistor of a pull-up driver illustrated in FIG. 7, according to an exemplary embodiment of the inventive concept.
Figure 9:
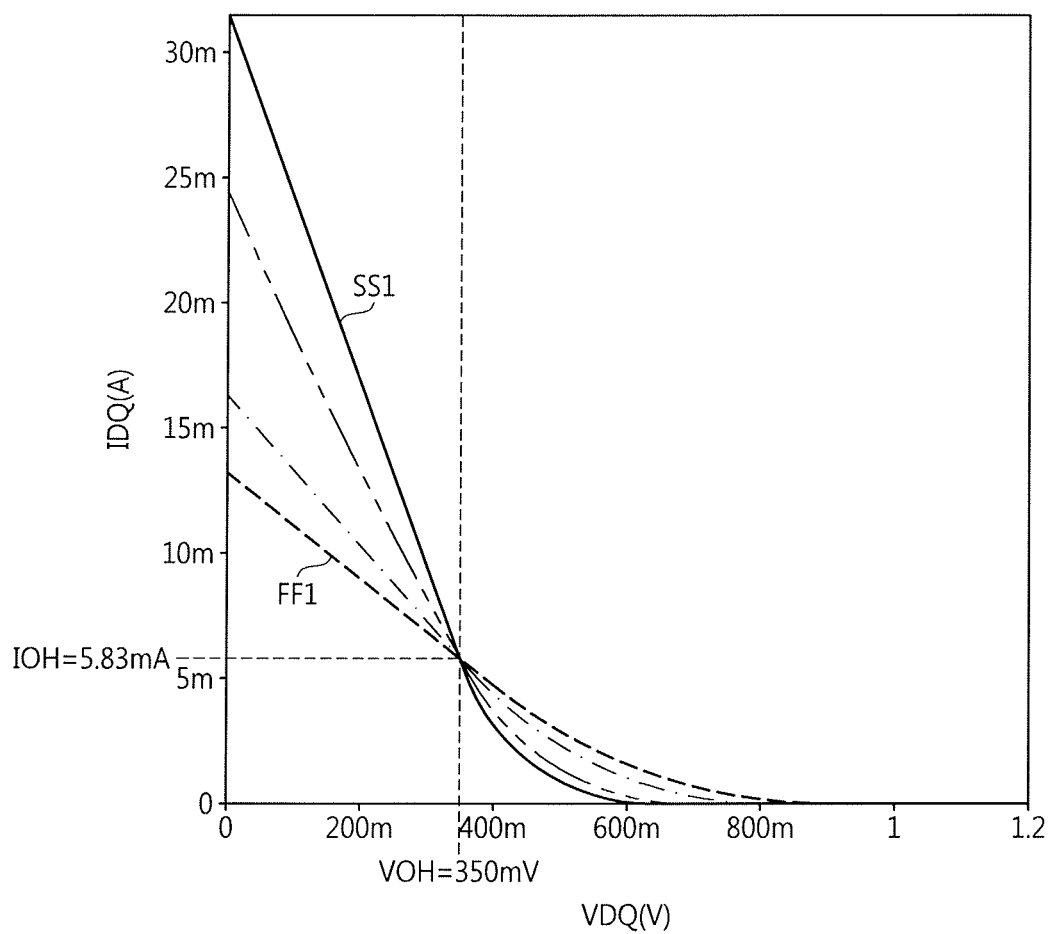
FIG. 9 is a graph of data voltage versus data current when the equivalent transistor illustrated in FIG. 8 operates according to a comparison example.
Figure 10:
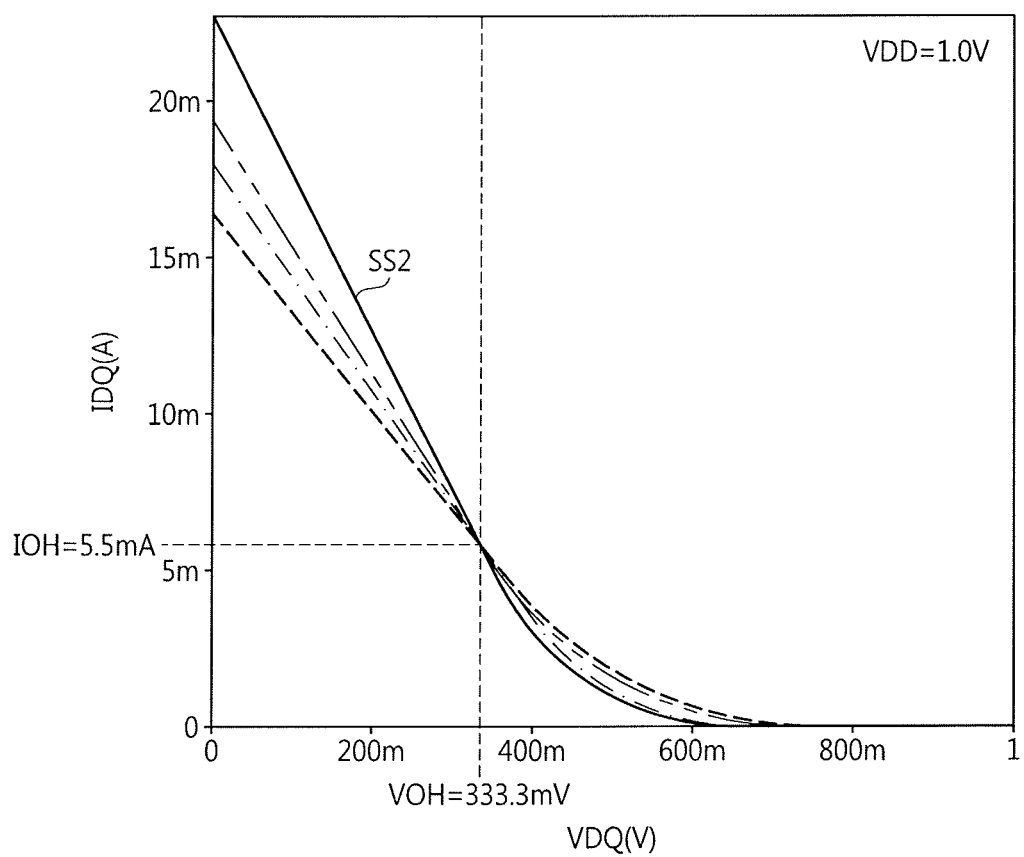
FIGS. 10 through 12 are graphs of data voltage versus data current when the equivalent transistor illustrated in FIG. 8 operates according to exemplary embodiments of the inventive concept.
Figure 11:
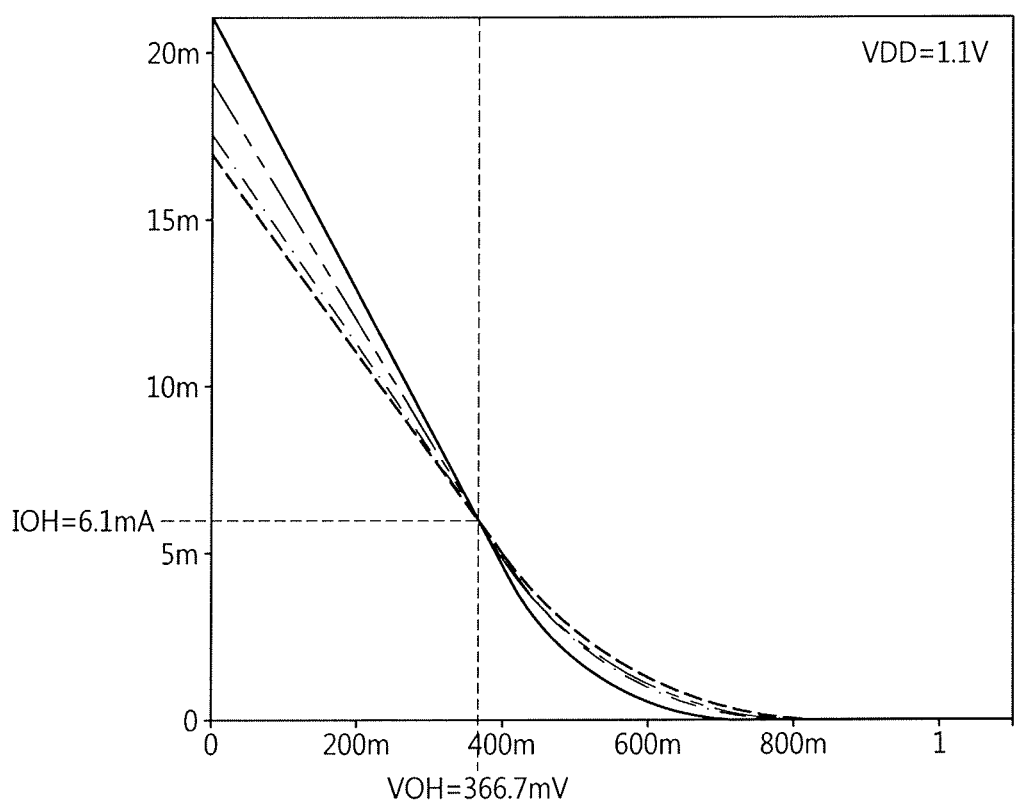
Figure 12:
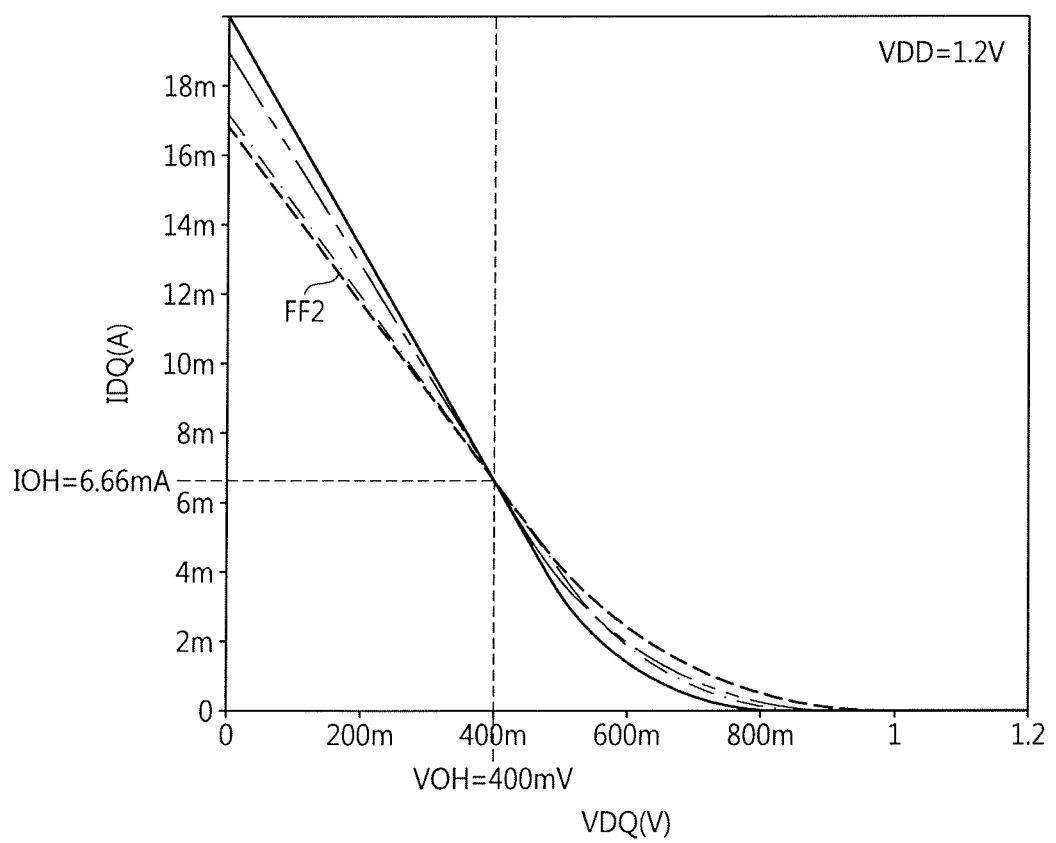
Figure 13:
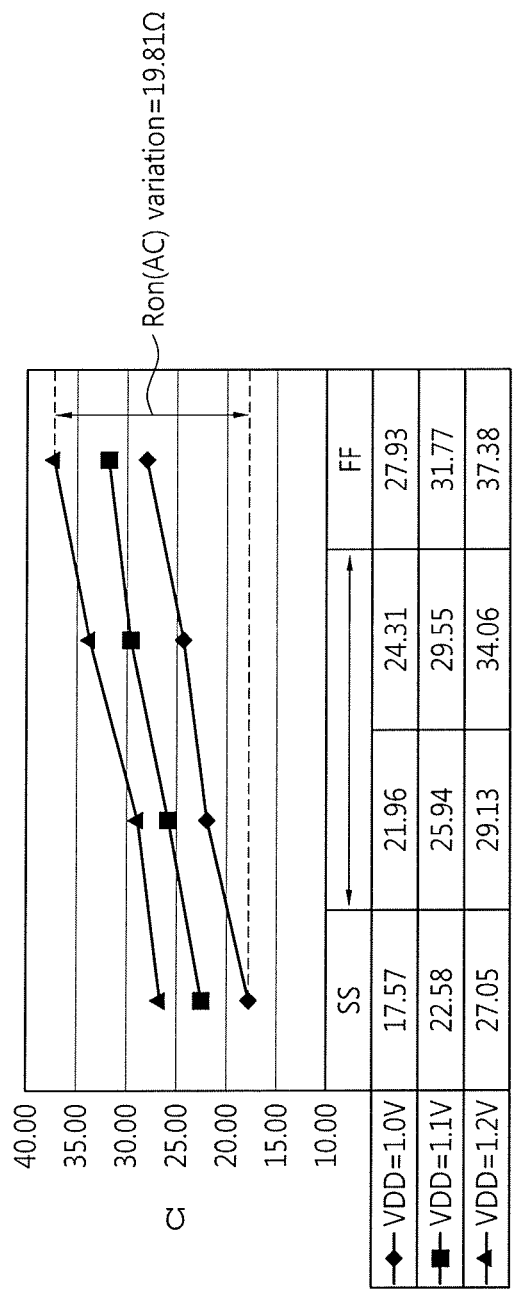
FIG. 13 is a diagram illustrating the relationship between power supply voltages illustrated in FIGS. 10 through 12 and alternating current on-resistance, according to an exemplary embodiment of the inventive concept.

FIG. 8 is a diagram of an equivalent transistor in the pull-up driver 292 illustrated in FIG. 7, according to an exemplary embodiment of the inventive concept. FIG. 9 is a graph of data voltage versus data current when the equivalent transistor illustrated in FIG. 8 operates according to a comparison example. FIGS. 10 through 12 are graphs of data voltage versus data current when the equivalent transistor illustrated in FIG. 8 operates according to exemplary embodiments of the inventive concept. FIG. 13 is a diagram illustrating the relationship between power supply voltages VDD illustrated in FIGS. 10 through 12 and Ron AC, according to an exemplary embodiment of the inventive concept.

Referring to FIGS. 3 and 5 and FIGS. 7 through 13, a group of the 0th through n-th pull-up transistors NU0 through NUn included in the pull-up driver 292 may be represented with a single equivalent NMOS transistor NU. In the equivalent NMOS transistor NU of FIG. 8, the pull-up operating signal OP_PU, the power supply voltage VDDQ, and a data voltage VDQ may respectively correspond to a gate voltage, a drain voltage, and a source voltage.

The pull-up operating signal OP_PU includes a plurality of the bits OP_PU0 through OP_PUn and is thus assumed as a voltage with a particular level, which determines a data current IDQ generated by the equivalent NMOS transistor NU. The data voltage VDQ is the source voltage of the equivalent NMOS transistor NU and is determined depending on the drain voltage, e.g., the power supply voltage VDDQ and the data current IDQ flowing in the equivalent NMOS transistor NU when the equivalent NMOS transistor NU is connected to a floating node instead of the sixth node N6 in FIG. 7.

The Ron AC is the resistance of the equivalent NMOS transistor NU when the equivalent NMOS transistor NU is in a turn-on state. The Ron AC is the same as the inverse number of the slope between the data voltage VDQ and the data current IDQ at the data voltage VDQ the same as the VOH. The internal data DATA substantially corresponds to an AC waveform (e.g., a sine wave). Therefore, the pull-up operating signal OP_PU, which expresses a value represented by the bits OP_PU0 through OP_PUn of the pull-up operating signal OP_PU in a single scalar, may also substantially correspond to an AC waveform.

When the pull-up operating signal OP_PU is input to the equivalent NMOS transistor NU, the data current IDQ may be generated in an inverse proportion to the Ron AC occurring with respect to the pull-up operating signal OP_PU. Accordingly, as the Ron AC decreases, a variation of the data current IDQ increases with respect to a certain variation of the pull-up operating signal OP_PU. When the source terminal of the equivalent NMOS transistor NU is connected to the sixth node N6 in FIG. 7, the data signal DQ is determined depending on both the data current IDQ and the resistance of the ODT resistor $R_{SOC.ODT}$ of the memory controller 300.

In other words, even when the VOH of the data signal DQ is calibrated to a particular VOH, the actual VOH of the data signal DQ may be different from the particular VOH depending on the Ron AC of the equivalent NMOS transistor NU in the pull-up driver 292 because the internal data DATA has an AC waveform.

FIG. 9 shows the result of simulating the relationship between the data voltage VDQ and the data current IDQ when the VOH is calibrated to 350 mV regardless of the power supply voltage VDDQ when the power supply voltage VDDQ is 1.0 V, 1.1 V, or 1.2 V and PVT conditions vary. Since the VOH is calibrated to 350 mV, the data current IDQ is about 5.83 mA (see IOH in FIG. 9) when the data voltage VDQ is 350 mV (see VOH in FIG. 9) according to Ohm's law in relation with the ODT resistor $R_{SOC.ODT}$ of the memory controller 300.

The inverse number of the slope when the data voltage VDQ is the calibrated VOH, e.g., 350 mV, is the Ron AC. When the power supply voltage VDDQ is 1.0 V, 1.1 V, or 1.2 V and the PVT conditions vary, the PVT corner of the Ron AC appears in a first slow corner SS1 and a first fast corner FF1.

The Ron AC may be about 13.69Ω at the first slow corner SS1 and may be about 50.72Ω at the first fast corner FF1. In other words, when the power supply voltage VDDQ is 1.0 V, 1.1 V, or 1.2 V and the PVT conditions vary, the variation in the Ron AC may be 50.72-13.69=about 37.03Ω.

FIGS. 10 through 12 show the results of simulating the relationship between the data voltage VDQ and the data current IDQ when the VOH is calibrated to VDDQ/3 in proportion to the power supply voltage VDDQ and when the power supply voltage VDDQ is 1.0V (in FIG. 10), 1.1V (in FIG. 11) and 1.2 V (in FIG. 12) and the PVT conditions vary. Since the VOH is calibrated to about 333.3 mV (in FIG. 10), 366.7 mV (in FIG. 11), and 400 mV (in FIG. 12), the data current IDQ is about 5.5 mA (in FIG. 10), 6.1 mA (in FIG. 11), and 6.66 mA (in FIG. 12) when the data voltage VDQ is about 333.3 mV (in FIG. 10), 366.7 mV (in FIG. 11), and 400 mV (in FIG. 12) according to Ohm's law in relation with the ODT resistor $R_{SOC.ODT}$ of the memory controller 300.

The inverse number of the slope when the data voltage VDQ is the calibrated VOH, e.g., 333.3 mV, 366.7 mV, or 400 mV in FIG. 10, 11, or 12 is the Ron AC. FIG. 13 shows the variation in the Ron AC with respect to the PVT conditions under the VDDQ conditions respectively given in FIGS. 10 through 12.

In detail, when VDDQ is 1.0 V, the Ron AC varies from about 17.57Ω to about 27.93Ω with respect to the PVT conditions. When VDDQ is 1.1 V, the Ron AC varies from about 22.58Ω to about 31.77Ω with respect to the PVT conditions. When VDDQ is 1.2 V, the Ron AC varies from about 27.05Ω to about 37.38Ω with respect to the PVT conditions. Accordingly, when the VOH is calibrated in proportion to the power supply voltage VDDQ, the PVT corner of the Ron AC appears in a second slow corner SS2 in FIG. 10 and a second fast corner FF2 in FIG. 12 when the power supply voltage VDDQ is 1.0 V, 1.1 V, or 1.2 V and the PVT conditions vary.

The Ron AC may be about 17.57Ω at the second slow corner SS2 and may be about 37.38Ω at the second fast corner FF2. In other words, when the power supply voltage VDDQ is 1.0 V, 1.1 V, or 1.2 V and the PVT conditions vary, the variation in the Ron AC may be 37.38-17.57=about 19.81Ω.

Consequently, when the VOH of the data signal DQ is fixedly calibrated regardless of the power supply voltage VDDQ, the variation in the Ron AC is about 37.03Ω. However, when the VOH of the data signal DQ is calibrated in proportion to the power supply voltage VDDQ, the variation in the Ron AC is about 19.81Ω. In other words, when the VOH of the data signal DQ is calibrated in proportion to the power supply voltage VDDQ, the variation in the Ron AC is reduced.

Figure 14:
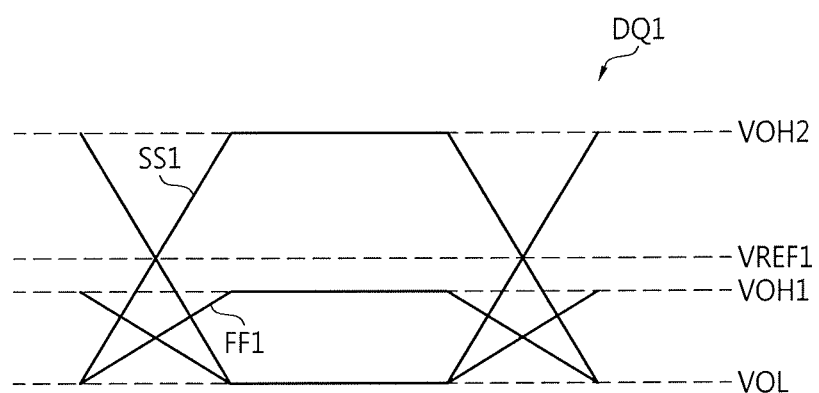
FIG. 14 is a diagram illustrating the change in VOH with respect to process-voltage-temperature (PVT) conditions when the pull-up driver illustrated in FIG. 7 operates according to a comparison example.
Figure 15:
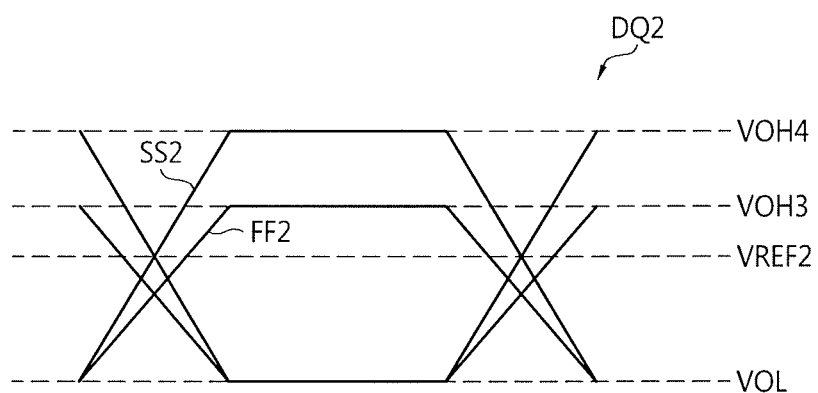
FIG. 15 is a diagram illustrating the change in VOH with respect to PVT conditions when the pull-up driver illustrated in FIG. 7 operates according to an exemplary embodiment of the inventive concept.

FIG. 14 is a diagram illustrating the change in VOH with respect to PVT conditions when the pull-up driver 292 illustrated in FIG. 7 operates according to a comparison example. FIG. 15 is a diagram illustrating the change in VOH with respect to the PVT conditions when the pull-up driver 292 illustrated in FIG. 7 operates according to an exemplary embodiment of the inventive concept.

Referring to FIGS. 3 and 5 and FIGS. 7 through 15, FIG. 14 shows the waveforms of a first data signal DQ1 at the first slow corner SS1 and the first fast corner FF1 when the VOH of the data signal DQ is fixedly calibrated regardless of the power supply voltage VDDQ. The first data signal DQ1 swings between VOL and VOH1 at the first fast corner FF1 and swings between VOL and VOH2 at the first slow corner SS1. VOH1 is less than VOH2 because a Ron AC of about 13.69Ω at the first slow corner SS1 is less than a Ron AC of 50.72Ω at the first fast corner FF1.

FIG. 15 shows the waveforms of a second data signal DQ2 at the second slow corner SS2 and the second fast corner FF2 when the VOH of the data signal DQ is calibrated in proportion to the power supply voltage VDDQ. The second data signal DQ2 swings between VOL and VOH3 at the second fast corner FF2 and swings between VOL and VOH4 at the second slow corner SS2. VOH3 is less than VOH4 because a Ron AC of about 17.57Ω at the second slow corner SS2 is less than a Ron AC of 37.38Ω at the second fast corner FF2.

As the Ron AC of the equivalent NMOS transistor NU of the pull-up driver 292 decreases, the variation in the data current IDQ and the data signal DQ corresponding to the pull-up operating signal OP_PU increases. As the Ron AC of the equivalent NMOS transistor NU of the pull-up driver 292 increases, the variation in the data current IDQ and the data signal DQ corresponding to the pull-up operating signal OP_PU decreases.

The difference between VOH1 and VOH2 is greater than the difference between VOH3 and VOH4, as shown in FIGS. 14 and 15. This is because the variation in the Ron AC when the VOH of the data signal DQ is fixedly calibrated regardless of the power supply voltage VDDQ is greater than that when the VOH of the data signal DQ is calibrated in proportion to the power supply voltage VDDQ.

The memory controller 300 may receive the data signal DQ from each of the dies RAM0 through RAMp, may determine a VOH and VOL of the data signal DQ, and may determine the reference voltage VREF (in FIG. 4) from the VOH and the VOL. The memory controller 300 may compare the data signal DQ with the reference voltage VREF and may determine a data value 0 or 1.

However, even when the data signal DQ is received from one die, the SI of the data signal DQ may deteriorate when the difference in VOH (e.g., the difference between VOH1 and VOH2 or the difference between VOH3 and VOH4) increases under varying PVT conditions. In other words, when a first reference voltage VREF1 is determined at the first slow corner SS1, as shown in FIG. 14, and when a data value of the data signal DQ is determined at the first fast corner FF1 under the varying PVT conditions, all data values of the data signal DQ are determined as "0" regardless of the low level, e.g., VOL, and the high level, e.g., VOH1, of the data signal DQ. As a result, noise may occur. In particular, when the data output circuit 200 is implemented in an LVSTL structure, the noise of the data signal DQ may become worse.

However, when a second reference voltage VREF2 is determined at the second slow corner SS2, as shown in FIG. 15, and when a data value of the data signal DQ is determined at the second fast corner FF2 under the varying PVT conditions, each data value of the data signal DQ is determined as "1" or "0" according to the high level, e.g., VOH3, and the low level, e.g., VOL, of the data signal DQ. As a result, noise may not occur.

In the semiconductor memory device 100 according to an exemplary embodiment of the inventive concept, the VOH of the data signal DQ is determined in proportion to the power supply voltage VDDQ, so that noise occurring under varying PVT conditions can be reduced.

Figure 16:
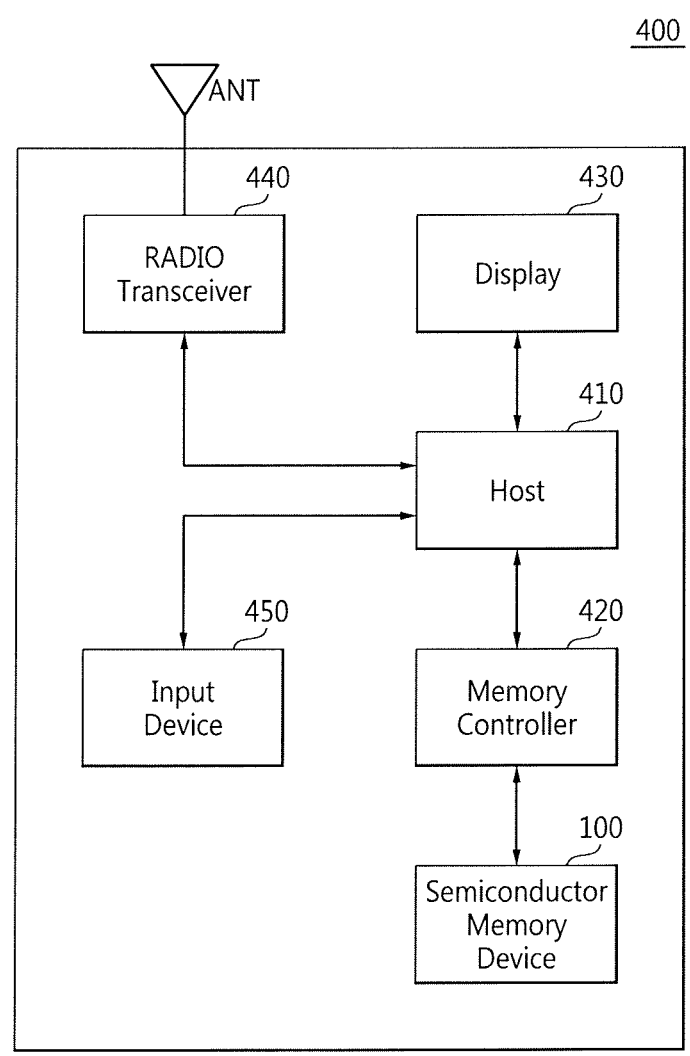
FIG. 16 is a diagram of a computer system including the semiconductor memory device illustrated in FIG. 1 according to an exemplary embodiment of the inventive concept.

FIG. 16 is a diagram of a computer system 400 including the semiconductor memory device 100 illustrated in FIG. 1 according to an exemplary embodiment of the inventive concept. Referring to FIGS. 1 and 16, the computer system 400 including the semiconductor memory device 100 illustrated in FIG. 1 may be implemented as a cellular phone, a smart phone, a personal digital assistant (PDA), or a radio communication system.

The computer system 400 includes the semiconductor memory device 100 and a memory controller 420 for controlling the operations of the semiconductor memory device 100. The memory controller 420 may control a data access operation, e.g., a write operation or a read operation, of the semiconductor memory device 100 according to the control of a host 410. The memory controller 420 may be the memory controller 300 illustrated in FIG. 1.

Data of the semiconductor memory device 100 may be displayed through a display 430 according to the control of the host 410 and the memory controller 420. A radio transceiver 440 may transmit and receive radio signals through an antenna ANT. The radio transceiver 440 may convert radio signals received through the antenna ANT into signals that can be processed by the host 410. The host 410 may process the signals output from the radio transceiver 440 and may transmit the processed signals to the memory controller 420 or the display 430. The memory controller 420 may store the signals processed by the host 410 in the semiconductor memory device 100.

The radio transceiver 440 may also convert signals output from the host 410 into radio signals and output the radio signals to an external device through the antenna ANT. An input device 450 enables control signals for controlling the operation of the host 410 or data to be processed by the host 410 to be input to the computer system 400. The input device 450 may be implemented as a pointing device such as a touch pad or a computer mouse, a keypad, or a keyboard.

The host 410 may control the operation of the display 430 to display data output from the memory controller 420, data output from the radio transceiver 440, or data output from the input device 450. The memory controller 420, which controls the operations of the semiconductor memory device 100, may be implemented as a part of the host 410 or as a separate chip.

Figure 17:
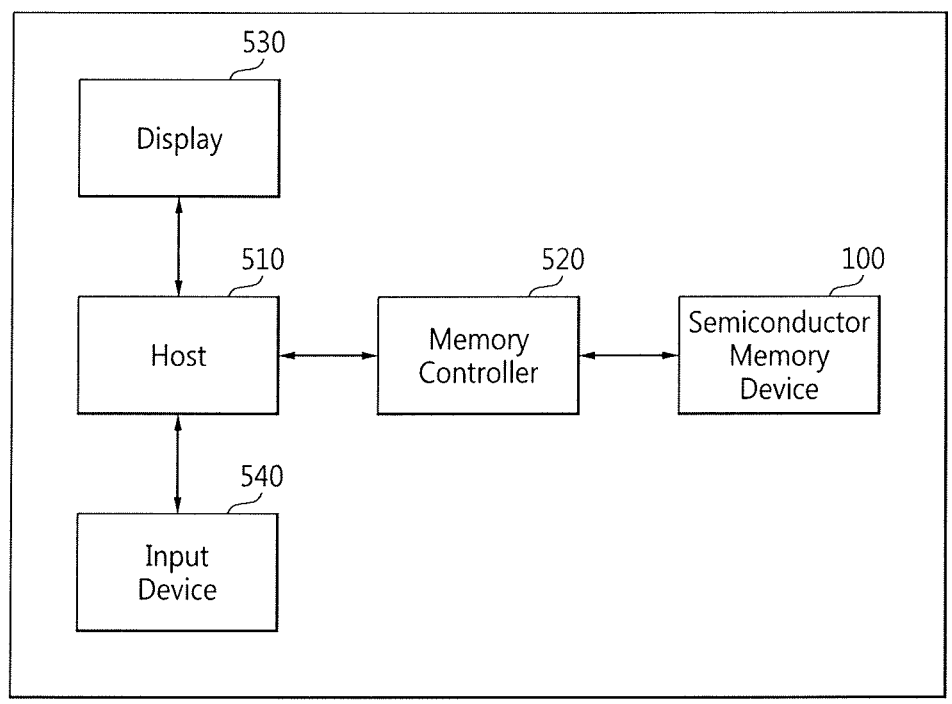
FIG. 17 is a block diagram of a computer system including the semiconductor memory device illustrated in FIG. 1 according to an exemplary embodiment of the inventive concept.

FIG. 17 is a block diagram of a computer system 500 including the semiconductor memory device 100 illustrated in FIG. 1 according to an exemplary embodiment of the inventive concept. Referring to FIGS. 1 and 17, the computer system 500 may be implemented as a personal computer (PC), a tablet PC, a net-book, an e-reader, a PDA, a portable multimedia player (PMP), an MPEG Audio Layer-3 (MP3) player, or an MPEG Audio Layer-4 (MP4) player.

The computer system 500 includes a host 510, the semiconductor memory device 100, a memory controller 520 for controlling the data processing operations of the semiconductor memory device 100, a display 530 and an input device 540.

The host 510 may display data stored in the semiconductor memory device 100 through the display 530 according to data input through the input device 540. The input device 540 may be implemented by a pointing device such as a touch pad or a computer mouse, a keypad, or a keyboard.

The host 510 may control the overall operation of the computer system 500 and the operations of the memory controller 520. The memory controller 520 may be the memory controller 300 illustrated in FIG. 1. The memory controller 520, which may control the operations of the semiconductor memory device 100, may be implemented as a part of the host 510 or as a separate chip.

Figure 18:
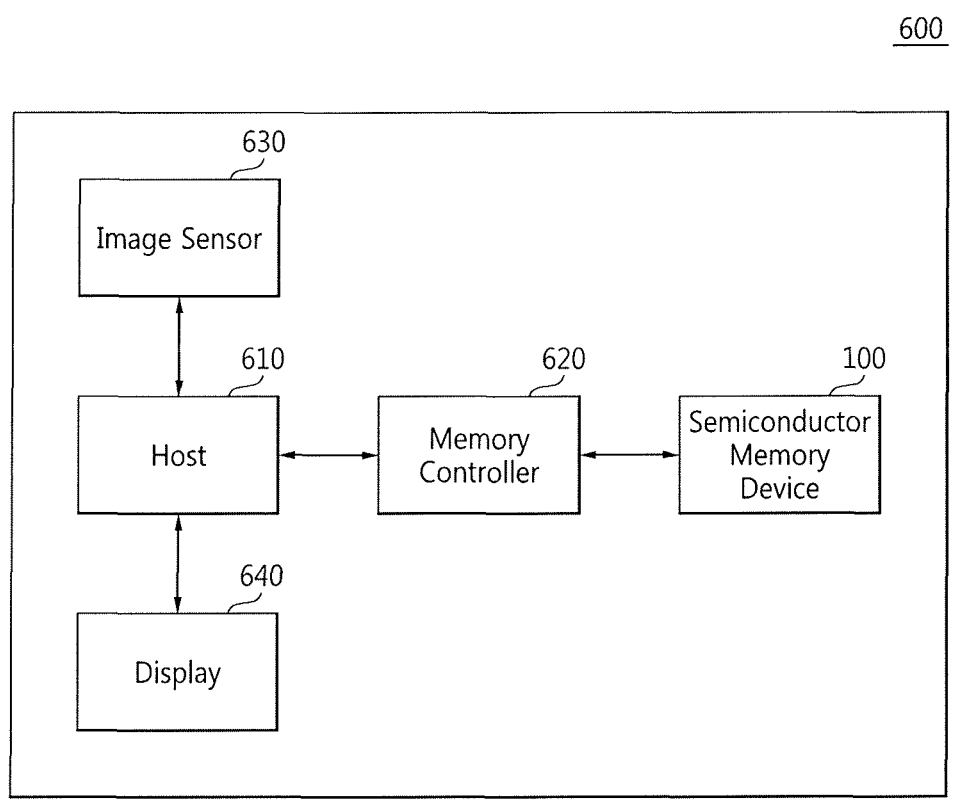
FIG. 18 is a block diagram of a computer system including the semiconductor memory device illustrated in FIG. 1 according to an exemplary embodiment of the inventive concept.

FIG. 18 is a block diagram of a computer system 600 including the semiconductor memory device 100 illustrated in FIG. 1 according to an exemplary embodiment of the inventive concept. The computer system 600 may be implemented as an image processing device such as a digital camera, a cellular phone equipped with a digital camera, or a smart phone equipped with a digital camera.

The computer system 600 includes a host 610, the semiconductor memory device 100 and a memory controller 620 for controlling the data processing operations, such as a write operation and a read operation, of the semiconductor memory device 100. An image sensor 630 included in the computer system 600 converts optical images into digital signals and outputs the digital signals to the host 610 or the memory controller 620. The digital signals may be controlled by the host 610 to be displayed through a display 640 or stored in the semiconductor memory device 100 through the memory controller 620.

Data stored in the semiconductor memory device 100 may be displayed through the display 640 according to the control of the host 610 or the memory controller 620. The memory controller 620, which may control the operations of the semiconductor memory device 100, may be implemented as a part of the host 610 or as a separate chip. The memory controller 620 may be the memory controller 300 illustrated in FIG. 1.

Figure 19:
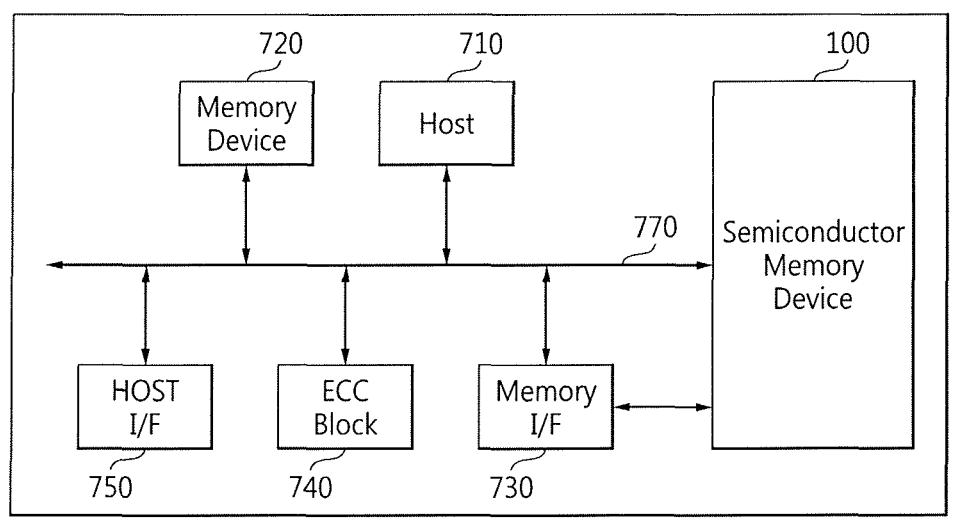
FIG. 19 is a block diagram of a computer system including the semiconductor memory device illustrated in FIG. 1 according to an exemplary embodiment of the inventive concept.

FIG. 19 is a block diagram of a computer system 700 including the semiconductor memory device 100 illustrated in FIG. 1 according to an exemplary embodiment of the inventive concept. The computer system 700 includes the semiconductor memory device 100 and a host 710 for controlling the operations of the semiconductor memory device 100. The computer system 700 also includes a system memory 720 which may be used an operation memory of the host 710, a memory interface 730, an error correction code (ECC) block 740, and a host interface 750.

The system memory 720 may be implemented by a non-volatile memory such as a ROM or a volatile memory such as an SRAM. The host 710 connected with the computer system 700 may perform data communication with the semiconductor memory device 100 through the memory interface 730 and the host interface 750.

The ECC block 740 is controlled by the host 710 to detect an error bit included in data output from the semiconductor memory device 100 through the memory interface 730, correct the error bit, and transmit the error-corrected data to the host through the host interface 750. The host 710 may control data communication among the memory interface 730, the ECC block 740, the host interface 750, and the system memory 720 through a bus 770. The computer system 700 may be implemented as a flash memory drive, a universal serial bus (USB) memory drive, an interchip USB (IC-USB) memory drive, or a memory stick.

Figure 20:
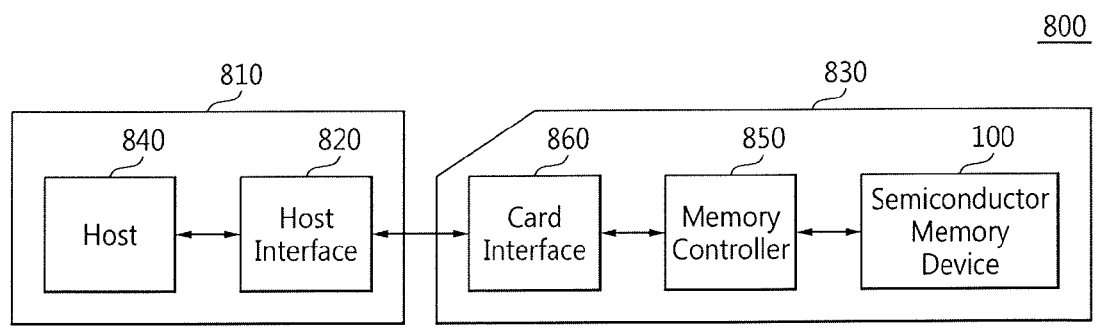
FIG. 20 is a block diagram of a computer system including the semiconductor memory device illustrated in FIG. 1 according to an exemplary embodiment of the inventive concept.

FIG. 20 is a block diagram of a computer system 800 including the semiconductor memory device 100 illustrated in FIG. 1 according to an exemplary embodiment of the inventive concept. Referring to FIGS. 1 and 20, the computer system 800 including the semiconductor memory device 100 illustrated in FIG. 1 may be implemented as a host computer 810 and a memory card 830 (or a smart card). The computer system 800 includes the host computer 810 and the memory card 830.

The host computer 810 includes a host 840 and a host interface 820. The memory card 830 includes the semiconductor memory device 100, a memory controller 850, and a card interface 860.

The memory controller 850 may control data exchange between the semiconductor memory device 100 and the card interface 860. The memory controller 850 may be the memory controller 300 illustrated in FIG. 1.

The card interface 860 may be a secure digital (SD) card interface or a multi-media card (MMC) interface, but the inventive concept is not restricted to the current embodiment.

When the memory card 830 is equipped with the host computer 810, the card interface 860 may interface the host 840 and the memory controller 850 for data exchange according to a protocol of the host 840.

The card interface 860 may support a USB protocol and an IC-USB protocol. Here, the card interface 860 may indicate a hardware supporting a protocol used by the host 330, a software installed in the hardware, or a signal transmission mode.

When the computer system 800 is connected with the host interface 820 of the host computer 810 such as a PC, a tablet PC, a digital camera, a digital audio player, a cellular phone, a console video game hardware, or a digital set-top box, the host interface 820 may perform data communication with the semiconductor memory device 100 through the card interface 860 and the memory controller 850 according to control of the host 840.

Figure 21:
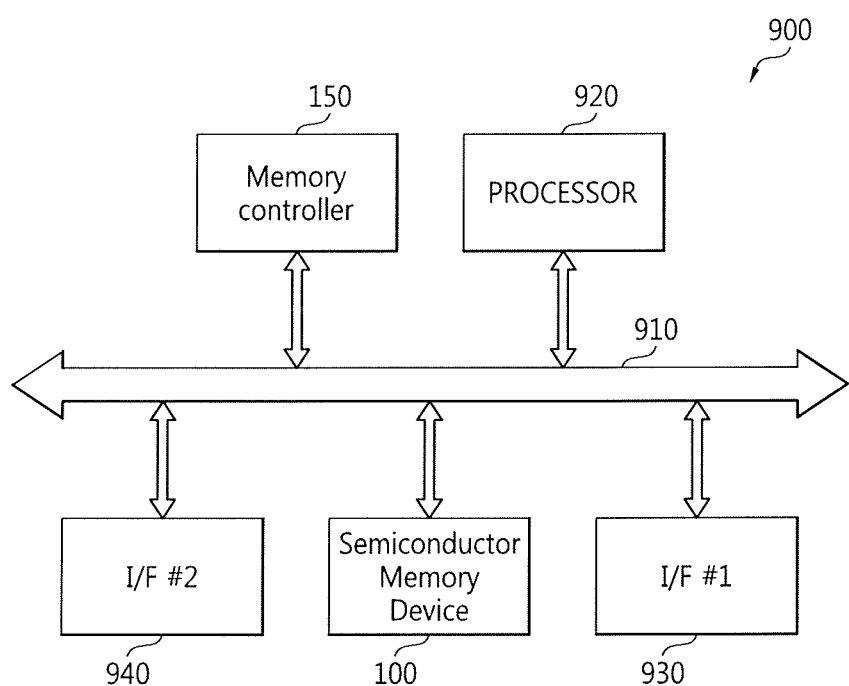
FIG. 21 is a block diagram of a computer system including the semiconductor memory device illustrated in FIG. 1 according to an exemplary embodiment of the inventive concept.

FIG. 21 is a block diagram of a computer system 900 including the semiconductor memory device 100 illustrated in FIG. 1 according to an exemplary embodiment of the inventive concept. Referring to FIGS. 1 and 21, the computer system 900 may include the semiconductor memory device 100, a memory controller 150, a processor 920, a first interface 930 and a second interface 940.

According to an exemplary embodiment of the inventive concept, the computer system 900 may include a portable device such as a cellular phone, an MP3 player, an MP4 player, a PDA, or a PMP.

According to an exemplary embodiment of the inventive concept, the computer system 900 may include a data processing system such as a PC, a notebook-sized PC, or a laptop computer According to an exemplary embodiment of the inventive concept, the computer system 900 may include a memory card such as an SD card or an MMC.

According to an exemplary embodiment of the inventive concept, the computer system 900 may include a smart card such or a solid state drive (SSD).

The semiconductor memory device 100, the memory controller 150 and the processor 920 may be implemented as a single chip, for example, a SoC, or may be implemented as a separate chip, respectively.

The processor 920 may process data input through the first interface 930 and write the processed data to the semiconductor memory device 100.

The processor 920 may read data stored in the semiconductor memory device 100 and output the read data to the outside via the first interface 930.

In this case, the first interface 930 may be an input/output device.

The second interface 940 may be an interface for wireless communication. The second interface 940 may be implemented by software or firmware.

Figure 22:
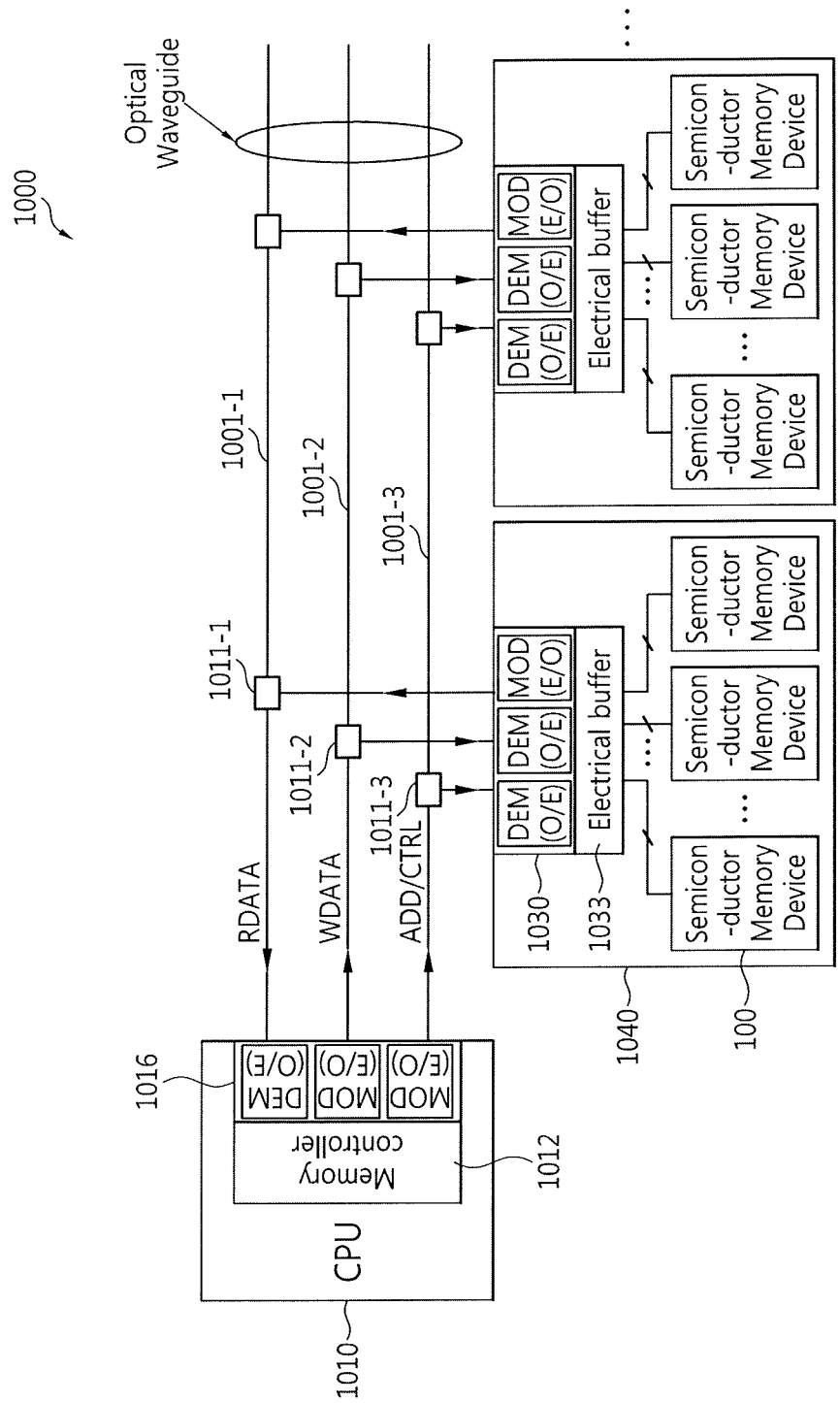
FIG. 22 is a diagram of a data processing system including the semiconductor memory device illustrated in FIG. 1 according to an exemplary embodiment of the inventive concept.

FIG. 22 is a diagram of a data processing system 1000 including the semiconductor memory device 100 illustrated in FIG. 1 according to an exemplary embodiment of the inventive concept. MOD(E/O) illustrated in FIG. 22 denotes an optical modulator used as an electro-optic (E/O) converter that converts an electrical signal into an optical signal and DEM(O/E) illustrated in FIG. 22 denotes an optical demodulator used as an opto-electric (O/E) converter that converts an optical signal into an electrical signal. Referring to FIG. 22, the data processing system 1000 includes a central processing unit (CPU) 1010, a plurality of data buses 1001-1 through 1001-3, and a plurality of memory modules 1040.

Each of the memory modules 1040 may transmit or receive optical signals through a plurality of couplers 1011-1 through 1011-3 respectively connected to the data buses 1001-1 through 1001-3. Each of the couplers 1011-1 through 1011-3 may be an electrical coupler or an optical coupler.

The CPU 1010 includes a memory controller 1012 and a first optical transceiver 1016 which includes at least one optical modulator MOD(E/O) and at least one optical demodulator DEM(O/E). The at least one optical demodulator DEM(O/E) is used as an O/E converter.

The memory controller 1012 may control an operation, e.g., a transmitting operation or a receiving operation, of the first optical transceiver 1016 under the control of the CPU 1010. The memory controller 1012 may be the memory controller 300 illustrated in FIG. 1.

In a write operation, a first optical modulator MOD(E/O) of the first optical transceiver 1016 may generate an optical signal ADD/CTRL by converting addresses and control signals under the control of the memory controller 1012 and may transmit the optical signal ADD/CTRL to the data bus 1001-3. Thereafter, a second optical modulator MOD(E/O) of the first optical transceiver 1016 may generate and transmit optical write data WDATA to the data bus 1001-2.

Each of the memory modules 1040 includes a second optical transceiver 1030 and a plurality of semiconductor memory devices 100. An optical demodulator DEM(O/E) included in the second optical transceiver 1030 may demodulate the optical write data WDATA received through the data bus 1001-2 and may transmit a demodulated electrical signal to at least one of the semiconductor memory devices 100. Each memory module 1040 may also include an electrical buffer 1033 which buffers the electrical signal output from the optical demodulator DEM(O/E). The electrical buffer 1033 may buffer a demodulated electrical signal and may transmit a buffered electrical signal to at least one of the semiconductor memory devices 100.

In a read operation, an electrical signal output from each semiconductor memory device 100 is converted into optical read data RDATA by an optical modulator MOD(E/O) included in the second optical transceiver 1030. The optical read data RDATA is transmitted to the first optical demodulator DEM(O/E) included in the CPU 1010 through the data bus 1001-1. The first optical demodulator DEM(O/E) demodulates the optical read data RDATA and transmits a demodulated electrical signal to the memory controller 1012.

Figure 23:
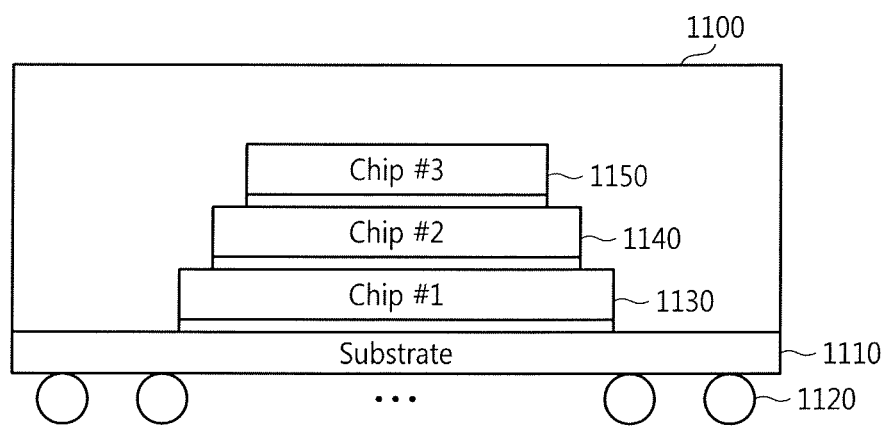
FIG. 23 is a schematic diagram of a multi-chip package including the semiconductor memory device illustrated in FIG. 1, according to an exemplary embodiment of the inventive concept.

FIG. 23 is a schematic diagram of a multi-chip package 1100 including the semiconductor memory device 100 illustrated in FIG. 1, according to an exemplary embodiment of the inventive concept. Referring to FIG. 23, the multi-chip package 1100 may include a plurality of semiconductor devices, e.g., first through third chips 1130, 1140, and 1150 which are sequentially stacked on a package substrate 1110. Each of the semiconductor devices 1130 through 1150 may include the semiconductor memory device 100. A memory controller for controlling the operations of the semiconductor devices 1130 through 1150 may be included within at least one of the semiconductor devices 1130 through 1150 or may be implemented on the package substrate 1110. A through-silicon via (TSV), a bonding wire, a bump, or a solder ball 1120 may be used to electrically connect the semiconductor devices 1130 through 1150 with one other.

The first semiconductor device 1130 may be a logic die including an input/output interface and a memory controller and the second and third semiconductor devices 1140 and 1150 may be a die, on which a plurality of memory devices are stacked, and may include a memory cell array. In this case, a memory device of the second semiconductor device 1140 and a memory device of the third semiconductor device 1150 may be the same or different types of memory.

Alternatively, each of the first through third semiconductor devices 1130 through 1150 may include a memory controller. In this case, the memory controller may be on the same die as a memory cell array or may be on a different die than the memory cell array.

As another alternative, the first semiconductor device 1130 may include an optical interface. A memory controller may be positioned in the first or second semiconductor device 1130 or 1140 and a memory device may be positioned in the second or third semiconductor device 1140 or 1150. The memory device may be connected with the memory controller through a TSV.

The multi-chip package 1100 may be implemented by using a hybrid memory cube (HMC) in which a memory controller and a memory cell array die are stacked. When the HMC is used, the performance of memory devices increases due to the increase of bandwidth, and thus, the area of the memory devices is minimized. As a result, power consumption and manufacturing cost can be reduced.

Figure 24:
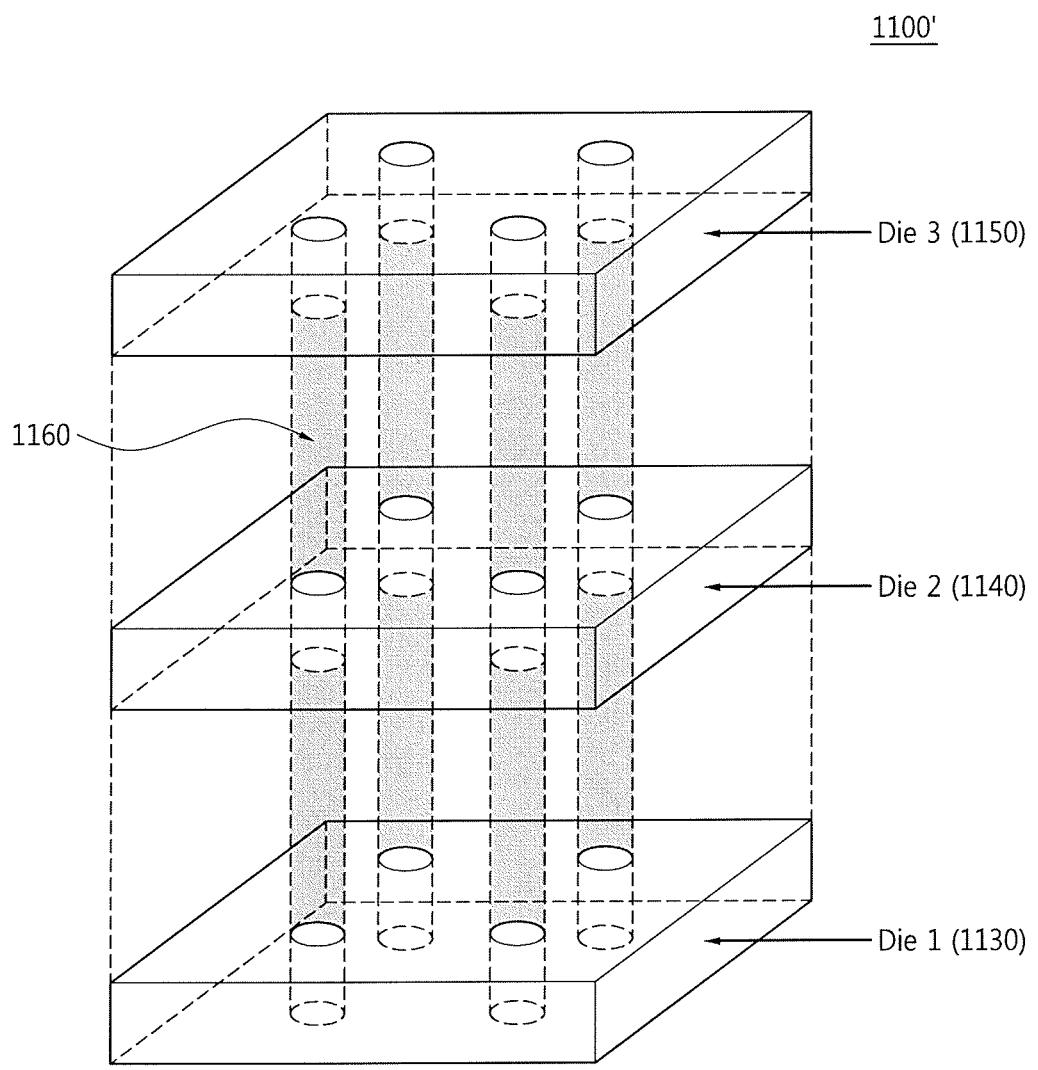
FIG. 24 is a three-dimensional diagram of an example of the multi-chip package illustrated in FIG. 23, according to an exemplary embodiment of the inventive concept.

FIG. 24 is a three-dimensional diagram of an example 1100' of the multi-chip package 1100 illustrated in FIG. 23, according to an exemplary embodiment of the inventive concept. Referring to FIG. 24, the multi-chip package 1100' includes a plurality of the dies 1130 through 1150 connected with one another through TSVs 1160 in a stack structure. Each of the dies 1130 through 1150 may include a plurality of circuit blocks and a periphery circuit to realize the functions of the semiconductor memory device 100. The dies 1130 through 1150 may be referred to as a cell array. The plurality of circuit blocks may be implemented by memory blocks.

The TSVs 1160 may be formed of a conductive material including a metal such as copper (Cu). The TSVs 1160 are arranged at the center of a silicon substrate. The silicon substrate surrounds the TSVs 1160. An insulating region may be disposed between the TSVs 1160 and the silicon substrate.

Exemplary embodiments of the inventive concept can also be embodied as computer-readable codes on a computer-readable recording medium. The computer-readable recording medium is any data storage device that can store data as a program which can be thereafter read by a computer system. Examples of the computer-readable recording medium include ROM, RAM, compact disc (CD)-ROMs, magnetic tapes, floppy disks, and optical data storage devices.

The computer-readable recording medium can also be distributed over a network of coupled computer systems so that the computer-readable code is stored and executed in a distributed fashion. In addition, functional programs, codes, and code segments to accomplish exemplary embodiments of the inventive concept can be implemented by programmers.

As described above, according to an exemplary embodiment of the inventive concept, a semiconductor memory device determines an output high level of a data signal in proportion to a power supply voltage, thereby reducing noise occurring under varying PVT conditions.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A method of operating a memory controller, comprising:
    receiving a data signal from a memory device, wherein the data signal has an output high level voltage (VOH);
    determining a reference voltage according to the VOH; and
    comparing the data signal with the reference voltage to determine a received data value,
    wherein the VOH is proportional to a power supply voltage (VDDQ).

2. The method of claim 1, wherein the VOH has a value of VDDQ/2.5.

3. The method of claim 1, wherein the VOH has a value of VDDQ/3.

4. The method of claim 1, wherein a value of the VOH depends on a resistance of an on-die termination (ODT) resistor of the memory controller.

5. The method of claim 4, wherein the VOH has a value of VDDQ/2.5 when the ODT resistor is 80, 120 or 240 ohms.

6. The method of claim 4, wherein the VOH has a value of VDDQ/3 when the ODT resistor is 40, 60, 80, 120 or 240 ohms.

7. The method of claim 1, wherein the data signal is generated at the memory device in response to an instruction from the memory controller.

8. The method of claim 7, wherein the instruction includes information about the VOH.

9. The method of claim 7, wherein the instruction includes information about an on-die termination (ODT) resistor of the memory controller.

10. The method of claim 7, wherein the instruction causes a mode register set (MRS) signal to be generated by the memory device.

11. The method of claim 10, wherein the MRS signal varies according to the value of an on-die termination (ODT) resistor of the memory controller.

12. The method of claim 1, wherein a mode register in the memory device includes information about an on-die termination (ODT) resistor of the memory controller.

13. The method of claim 1, wherein the memory device performs a calibration based on a mode register set (MRS) signal generated according to a target VOH and an on-die termination (ODT) value of the memory controller.

14. A memory controller, comprising:
    an on-die termination (ODT) resistor and a DQ pad, wherein the memory controller is configured to:
    receive, via the DQ pad, a data signal from a memory device, wherein the data signal has an output high level voltage (VOH);
    determine a reference voltage according to the VOH; and
    compare the data signal with the reference voltage to determine a received data value,
    wherein the VOH is proportional to a power supply voltage (VDDQ).

15. The controller of claim 14, wherein ODT resistor has a value of 40, 60, 80, 120 or 240 ohms.

16. A method of operating a memory controller, comprising:
    receiving a first data signal having a first output high level voltage (VOH), wherein the first VOH is proportional to a power supply voltage (VDDQ);
    outputting a command instructing a VOH of a second data signal to be changed; and
    receiving the second data signal, wherein the second data signal has the changed VOH, the changed VOH being proportional to VDDQ,
    wherein the first VOH and the changed VOH are different from each other.

17. The method of claim 16, wherein the first VOH is VDDQ/3.

18. The method of claim 16, wherein the changed VOH varies with an impedance of an on-die termination (ODT) resistor of the memory controller.

19. The method of claim 16, wherein the changed VOH is obtained by increasing or decreasing the VOH of the first data signal.

20. The method of claim 16, wherein the command includes information about an impedance of an on-die termination (ODT) resistor of the memory controller.

* * * * *